US008193067B2

(12) United States Patent (10) Patent No.: US 8,193,067 B2
Anderson et al. (45) Date of Patent: Jun. 5, 2012

(54) INTEGRATED CIRCUIT AND A METHOD USING INTEGRATED PROCESS STEPS TO FORM DEEP TRENCH ISOLATION STRUCTURES AND DEEP TRENCH CAPACITOR STRUCTURES FOR THE INTEGRATED CIRCUIT

(75) Inventors: Brent A. Anderson, Jericho, VT (US);
Andres Bryant, Burlington, VT (US);
Herbert L. Ho, New Windsor, NY (US);
Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 12/630,091

(22) Filed: Dec. 3, 2009

(65) Prior Publication Data

US 2011/0133310 A1    Jun. 9, 2011

(51) Int. Cl.
*H01L 21/20* (2006.01)
(52) U.S. Cl. .. 438/391; 257/301; 257/374; 257/E27.092
(58) Field of Classification Search .................. 257/301, 257/374, E27.092; 438/391
See application file for complete search history.

(56) References Cited

U.S. PATENT DOCUMENTS

| 5,614,431 | A | 3/1997 | DeBrosse |
| 6,271,142 | B1 | 8/2001 | Gruening et al. |
| 6,380,095 | B1 | 4/2002 | Liu et al. |
| 6,440,792 | B1 | 8/2002 | Shiao et al. |
| 7,019,348 | B2 * | 3/2006 | Tu .................................. 257/301 |
| 2003/0201511 | A1 | 10/2003 | Shin |
| 2004/0104418 | A1 | 6/2004 | Kowalski et al. |
| 2008/0283890 | A1 * | 11/2008 | Dyer ............................. 257/301 |
| 2009/0184392 | A1 | 7/2009 | Cheng et al. |

* cited by examiner

*Primary Examiner* — Howard Weiss
*Assistant Examiner* — John C Ingham
(74) *Attorney, Agent, or Firm* — Gibb I.P. Law Firm, LLC; David A. Cain, Esq.

(57) ABSTRACT

Disclosed is an integrated circuit having at least one deep trench isolation structure and a deep trench capacitor. A method of forming the integrated circuit incorporates a single etch process to simultaneously form first trench(es) and a second trenches for the deep trench isolation structure(s) and a deep trench capacitor, respectively. Following formation of a buried capacitor plate adjacent to the lower portion of the second trench, the trenches are lined with a conformal insulator layer and filled with a conductive material. Thus, for the deep trench capacitor, the conformal insulator layer functions as the capacitor dielectric and the conductive material as a capacitor plate in addition to the buried capacitor plate. A shallow trench isolation (STI) structure formed in the substrate extending across the top of the first trench(es) encapsulates the conductive material therein, thereby creating the deep trench isolation structure(s).

19 Claims, 18 Drawing Sheets

INTEGRATED CIRCUIT AND A METHOD USING INTEGRATED PROCESS STEPS TO FORM DEEP TRENCH ISOLATION STRUCTURES AND DEEP TRENCH CAPACITOR STRUCTURES FOR THE INTEGRATED CIRCUIT

BACKGROUND

1. Field of the Invention

The embodiments of the invention generally relate to integrated circuits and, more specifically, to an integrated circuit and a method using integrated process steps to form bulk deep trench isolation structures and deep trench capacitor structures (e.g., incorporated into embedded dynamic random access memory (eDRAM) cells) for the integrated circuit.

2. Description of the Related Art

Bulk device isolation is becoming more difficult at advanced process nodes (e.g., (e.g., at 32 nm and beyond). However, due to the lack of voltage scaling, shallow trench isolation (STI)) depths alone are not sufficient. Thus, current solutions for bulk device isolation currently involve dual-depth trench isolation. Specifically, STI typically provides isolation between same type devices within a given well and deep trench isolation (DTI) provide isolation between NWELLS and PWELLS within which p-type field effect transistors (PFETs) and n-type field effect transistors (NFETs) are formed, respectively. Unfortunately, forming the deep trench component of dual-depth trench isolation can be very complex and expensive, making it difficult to meet required groundrules.

SUMMARY

In view of the foregoing, disclosed herein are embodiments of an integrated circuit having, in a bulk substrate, at least one deep trench isolation structure and a deep trench capacitor. Also disclosed are embodiments of a method of forming the integrated circuit using integrated process steps. Specifically, the method embodiments can incorporate a single etch process to essentially simultaneously form, in a bulk semiconductor substrate, first and second trenches for a deep trench isolation structure and a deep trench capacitor, respectively. The width of the patterns used to form the trenches can be varied in order to selectively vary the depths of the trenches. Following formation of a buried capacitor plate adjacent to the lower portion of the second trench, both trenches can be essentially simultaneously lined with a conformal insulator layer and filled with a conductive material. Thus, for the deep trench capacitor, the conformal insulator layer lining the second trench functions as the capacitor dielectric and the conductive material within the second trench functions as a capacitor plate in addition to the buried capacitor plate. A shallow trench isolation (STI) structure can then be formed in the substrate extending across the top of the first trench in order to encapsulate the conductive material therein, thereby creating the deep trench isolation structure. By integrating these process steps many key and expensive process steps can be shared, thereby resulting in a much lower total cost with improved density and excellent isolation.

More particularly, disclosed is an embodiment of an integrated circuit having, in a bulk substrate, a deep trench isolation structure (e.g., that isolates an NWELL region from a PWELL region in a logic circuit or a static random access memory (SRAM) array) and a deep trench capacitor (e.g., that is incorporated as a storage node in an embedded dynamic random access memory (eDRAM) cell). Specifically, this circuit embodiment can comprise a substrate and, in the substrate, a first trench for the deep trench isolation structure and a second trench for the deep trench capacitor.

The same conformal insulator layer can line both the first and second trench and the same conductive material can be located within the first and second trenches on top of the conformal insulator layer, thereby filling the trenches. A buried capacitor plate can be located within the substrate adjacent to the lower portion of the second trench, thereby forming a deep trench capacitor in which the conformal insulator layer lining the second trench functions as the capacitor dielectric and the conductive material within the second trench functions as the other capacitor plate. A shallow trench isolation structure can be located above the conductive material in the first trench such that it in combination with the conformal insulator layer encapsulates the conductive material in the first trench, thereby forming the deep trench isolation structure.

Various devices can be located in the substrate. Specifically, n-type field effect transistors (NFETs) and p-type field effect transistors (PFETs) (e.g., for either a logic circuit or a static random access memory (SRAM) array) can be located in PWELL and NWELL regions of the substrate, respectively. Thus, the PFETs and NFETs will be isolated from each other by the deep trench isolation structure. Furthermore, at least one additional device can be located in the substrate adjacent to the second trench and can be electrically connected to the conductive material in the second trench. For example, this additional device can comprise, an additional FET that is located adjacent to the second trench such that one of its source/drain regions is electrically connected to the conductive material in the second trench (i.e., electrically connected to the conductive plate in the resulting deep trench capacitor), thereby creating an embedded dynamic random access memory (eDRAM) cell.

An embodiment of a method of forming the above-described integrated circuit, having a deep trench isolation structure and a deep trench capacitor in a bulk substrate, can comprise forming a first pattern and a second pattern in a mask layer on the substrate. Specifically, the first pattern can be designed for a first trench that will be used in the formation of a deep trench isolation structure (e.g., a deep trench isolation structure that will isolate an NWELL region from a PWELL region in a logic circuit or a static random access memory (SRAM) array). The second pattern can be designed for a second trench that will be used in the formation of a deep trench capacitor (e.g., a deep trench capacitor that will be incorporated as a storage node in an embedded dynamic random access memory (eDRAM) cell). Next, using the patterned mask layer, a single etch process can be performed in order to essentially simultaneously form both the first trench and the second trench in the substrate.

Once the trenches are formed, a buried capacitor plate for the deep trench capacitor can be formed in the substrate adjacent to the lower portion of the second trench. Then, a conformal insulator layer can be formed, essentially simultaneously lining both the first and second trenches and a conductive material can be deposited onto the conformal insulator layer, essentially simultaneously filling both the first and second trenches. Thus, for the deep trench capacitor, the conformal insulator layer lining the second trench functions as the capacitor dielectric and the conductive material within the second trench functions as a capacitor plate in addition to the buried capacitor plate. Subsequently, a shallow trench isolation structure can be formed above the conductive material in the first trench such that the shallow trench isolation structure in combination with the conformal insulator layer encapsulates the conductive material in the first trench, thereby creating the deep trench isolation structure.

Finally, devices can be formed in the substrate adjacent to the first and second trenches. Specifically, n-type field effect transistors (NFETs) and p-type field effect transistors (PFETs) (e.g., for either a logic circuit or a static random access memory (SRAM) array) can be formed in PWELL and NWELL regions of the substrate, respectively. Thus, the PFETs and NFETs will be isolated from each other by the deep trench isolation structure. Furthermore, at least one additional device can be formed in the substrate adjacent to the second trench and can be electrically connected to the conductive material in the second trench. For example, this additional device can comprise an additional field effect transistor that is formed adjacent to the second trench such that one of its source/drain regions is electrically connected to the conductive material in the second trench (i.e., electrically connected to the conductive plate in the resulting deep trench capacitor), thereby creating an embedded dynamic random access memory (eDRAM) cell.

Also disclosed is another embodiment of an integrated circuit having, in a bulk substrate, multiple adjacent deep trench isolation structures (e.g., that isolate an NWELL region from a PWELL region in a logic circuit or a static random access memory (SRAM) array) and a deep trench capacitor (e.g., that is incorporated as a storage node in an embedded dynamic random access memory (eDRAM) cell). Specifically, this circuit embodiment can comprise a substrate and, in the substrate, at least two adjacent first trenches for at least two adjacent deep trench isolation structures and a second trench for the deep trench capacitor.

The same conformal insulator layer can line each of the trenches and the same conductive material can be located within each of the trenches on top of the conformal insulator layer, thereby filling the trenches. A buried capacitor plate can be located within the substrate adjacent to the lower portion of the second trench, thereby forming a deep trench capacitor in which the conformal insulator layer lining the second trench functions as the capacitor dielectric and the conductive material within the second trench functions as the other capacitor plate. At least one shallow trench isolation structure can be located above the conductive material in the first trenches such that it/they in combination with the conformal insulator layer encapsulate the conductive material in the first trenches, thereby forming the adjacent deep trench isolation structures.

Various devices can be located in the substrate. Specifically, n-type field effect transistors (NFETs) and p-type field effect transistors (PFETs) (e.g., for either a logic circuit or a static random access memory (SRAM) array) can be located in PWELL and NWELL regions of the substrate, respectively. Thus, the PFETs and NFETs will be isolated from each other by the adjacent deep trench isolation structures. Furthermore, at least one additional device can be located in the substrate adjacent to the second trench and can be electrically connected to the conductive material in the second trench. For example, this additional device can comprise an additional field effect transistor that is located adjacent to the second trench such that one of its source/drain regions is electrically connected to the conductive material in the second trench (i.e., electrically connected to the conductive plate in the resulting deep trench capacitor), thereby creating an embedded dynamic random access memory (eDRAM) cell.

An embodiment of a method of forming the above-described integrated circuit, having a multiple adjacent deep trench isolation structures and a deep trench capacitor in a bulk substrate, can comprise similarly forming a first pattern and a second pattern in a mask layer on a substrate. In this case, the first pattern can be designed for at least two adjacent first trenches that will be used in the formation of at least two adjacent deep trench isolation structures (e.g., a first continuous structure bordering a given well region and a second continuous structure adjacent to an outer edge of the first). The second pattern can be designed for a second trench that will be used in the formation of a deep trench capacitor (e.g., a deep trench capacitor that will be incorporated into an embedded dynamic random access memory (eDRAM) cell).

Next, using the patterned mask layer, a single etch process can be performed in order to essentially simultaneously form both the first trenches and the second trench in the substrate. It should be noted that the widths of the first and second patterns can be varied in order to selectively vary the resulting depths of the first and second trenches. Similarly, the widths of first and second sections of the first pattern can be varied in order to selectively vary the resulting depths of the adjacent first trenches.

Once the trenches are formed, a buried capacitor plate for the deep trench capacitor can be formed in the substrate adjacent to the lower portion of the second trench. Then, a conformal insulator layer can be formed, essentially simultaneously lining all of the trenches and a conductive material can be deposited onto the conformal insulator layer, essentially simultaneously filling all of the trenches. Thus, for the deep trench capacitor the conformal insulator layer lining the second trench functions as the capacitor dielectric and the conductive material within the second trench functions as a capacitor plate in addition to the buried capacitor plate. Subsequently, at least one shallow trench isolation structure can be formed above the conductive material in the first trenches such that the shallow trench isolation structure(s) in combination with the conformal insulator layer encapsulate the conductive material in the first trenches, thereby creating the adjacent deep trench isolation structures.

Finally, devices can be formed in the substrate. Specifically, n-type field effect transistors (NFETs) and p-type field effect transistors (PFETs) (e.g., for either a logic circuit or a static random access memory (SRAM) array) can be formed in PWELL and NWELL regions of the substrate, respectively. Thus, the PFETs and NFETs will be isolated from each other by the adjacent deep trench isolation structures. Furthermore, at least one additional device can be formed in the substrate adjacent to the second trench and can be electrically connected to the conductive material in the second trench. For example, this additional device can comprise an additional field effect transistor that is formed adjacent to the second trench such that one of its source/drain regions is electrically connected to the conductive material in the second trench (i.e., electrically connected to the conductive plate in the resulting deep trench capacitor), thereby creating an embedded dynamic random access memory (eDRAM) cell.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

The embodiments of the invention and the various features and advantageous details thereof are explained more fully with reference to the non-limiting embodiments that are illustrated in the accompanying drawings and detailed in the following description.

As mentioned above, bulk device isolation is becoming more difficult at advanced process nodes (e.g., (e.g., at 32 nm and beyond). Due to lack of voltage scaling, shallow trench isolation (STI)) depths alone are not sufficient. Thus, current solutions for bulk device isolation currently involve dual-depth trench isolation. Specifically, STI typically provides isolation between same type devices within a given well and deep trench isolation (DTI) provide isolation between NWELLS and PWELLS within which p-type field effect transistors (PFETs) and n-type field effect transistors (NFETs) are formed, respectively. Unfortunately, forming the deep trench component of dual-depth trench isolation can be very complex and expensive, making it difficult to meet required groundrules.

In view of the foregoing, disclosed herein are embodiments of an integrated circuit having, in a bulk substrate, at least one deep trench isolation structure and a deep trench capacitor. Also disclosed are embodiments of a method of forming the integrated circuit using integrated process steps. Specifically, the method embodiments can incorporate a single etch process to essentially simultaneously form, in a bulk semiconductor substrate, first and second trenches for a deep trench isolation structure and a deep trench capacitor, respectively. The width of the patterns used to form the trenches can be varied in order to selectively vary the depths of the trenches. Following formation of a buried capacitor plate adjacent to the lower portion of the second trench, both trenches can be essentially simultaneously lined with a conformal insulator layer and filled with a conductive material. Thus, for the deep trench capacitor, the conformal insulator layer lining the second trench functions as the capacitor dielectric and the conductive material within the second trench functions as a capacitor plate in addition to the buried capacitor plate. A shallow trench isolation (STI) structure can then be formed in the substrate extending across the top of the first trench in order to encapsulate the conductive material therein, thereby creating the deep trench isolation structure. By integrating these process steps many of key and expensive process steps can be shared, thereby resulting in a much lower total cost with improved density and excellent isolation.

Figure 1:
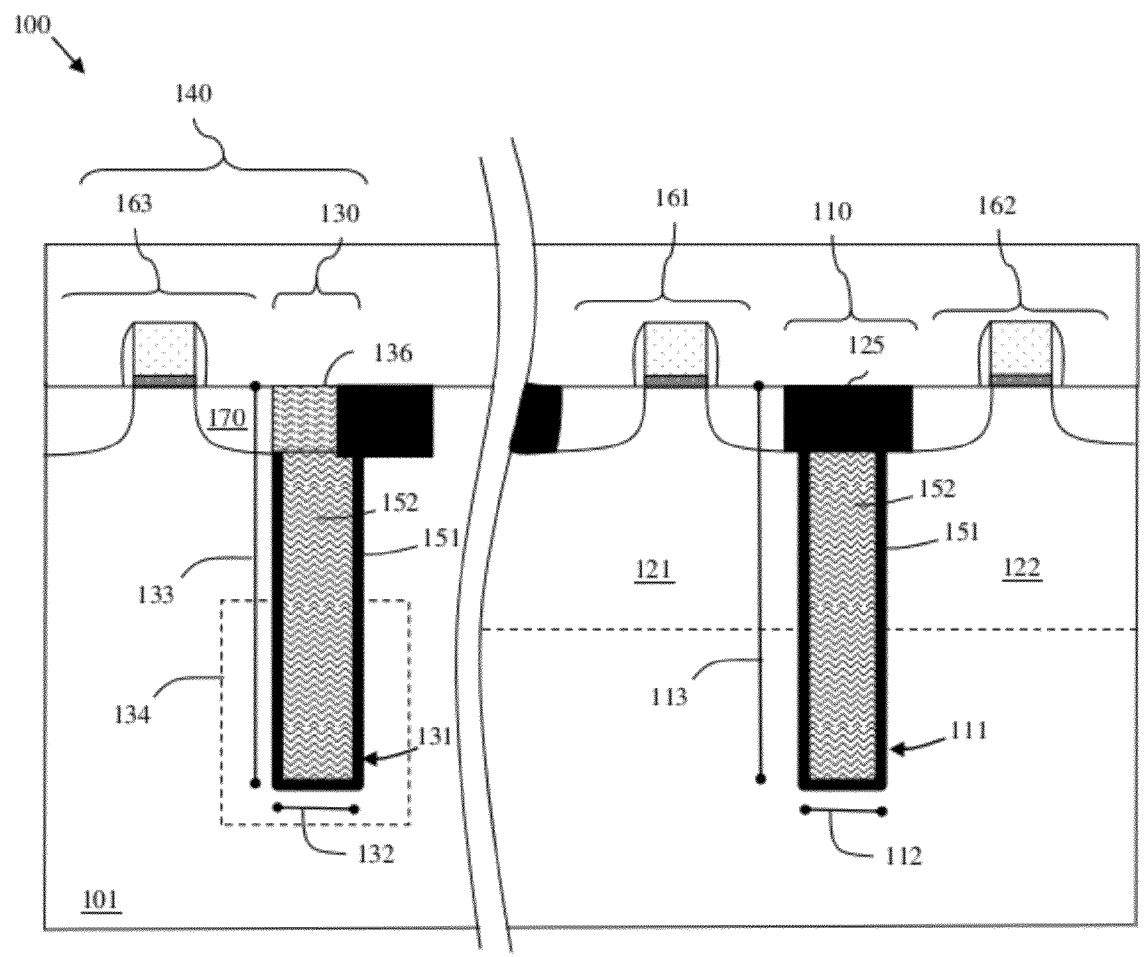
FIG. 1 is a cross-section diagram illustrating an embodiment of an integrated circuit.
Figure 2:
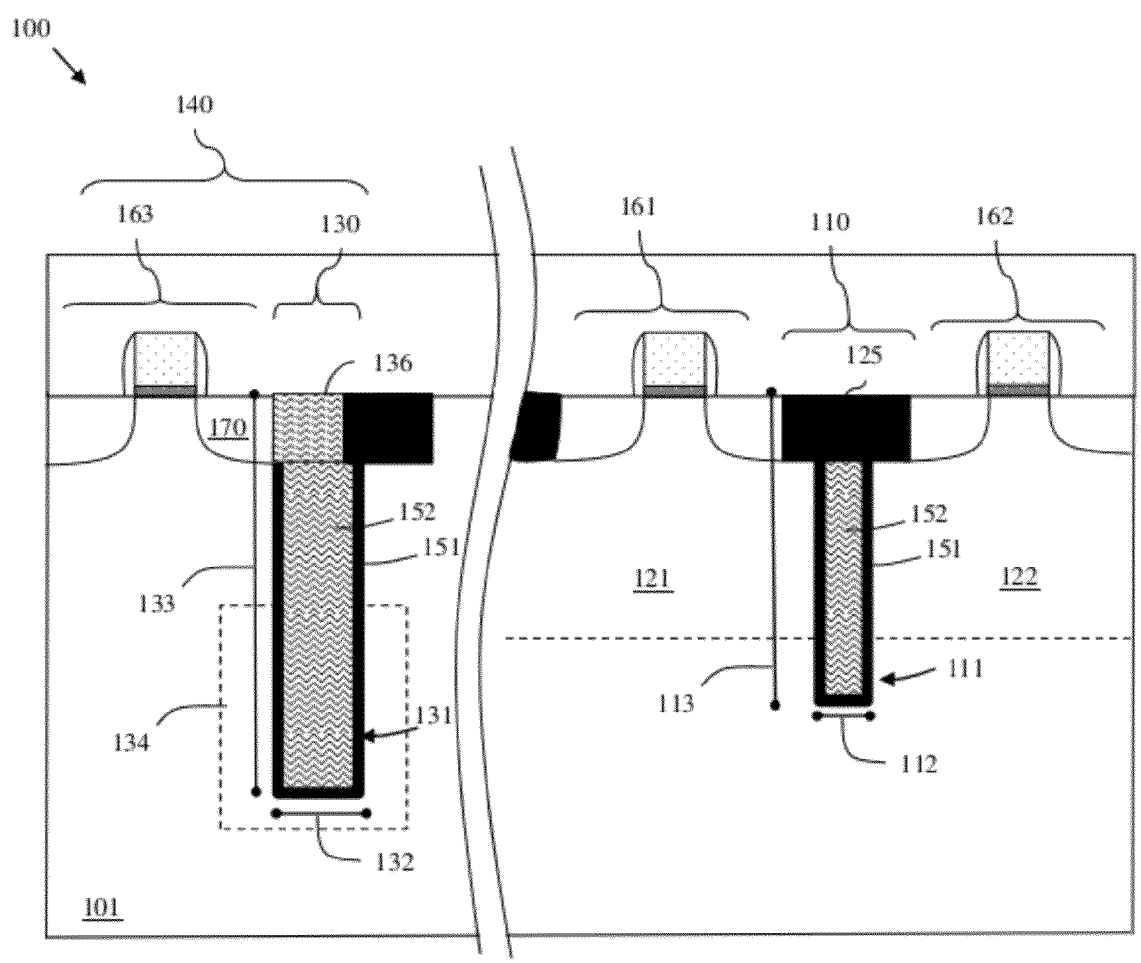
FIG. 2 is a cross-section diagram illustrating another embodiment of an integrated circuit.

More particularly, referring to FIGS. 1 and 2, disclosed are embodiments of an integrated circuit 100 having, in a bulk substrate 101, a deep trench isolation structure 110 and a deep trench capacitor 130. The deep trench isolation structure 110 can, for example, isolate an NWELL region 121 from a surrounding PWELL region 122 in, for example, either a logic circuit or a static random access memory (SRAM) array. The deep trench capacitor 130 can, for example, be incorporated into an embedded dynamic random access memory (eDRAM) cell 140.

Figure 3:
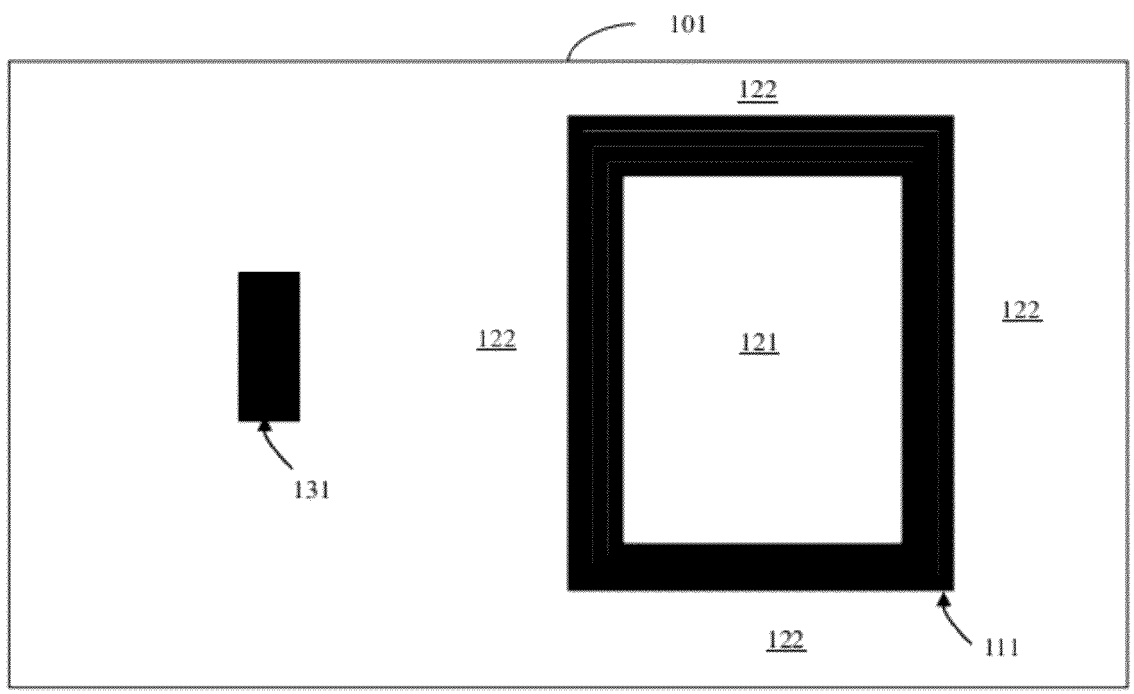
FIG. 3 is a top view diagram illustrating an exemplary layout for the trenches 111, 131 of FIG. 1 or FIG. 2.

Specifically, the integrated circuit 100 can comprise a substrate 101 (e.g., a bulk silicon substrate, such as a P-substrate). It can further comprise, in the substrate 101, a first trench 111 for the deep trench isolation structure 110 and a second trench 131 for the deep trench capacitor 130. As illustrated in FIG. 3, the first trench 111 can comprise, for example, a continuous trench structure (i.e., a trench structure without a beginning or an end) that essentially forms a moat having a particularly shape, such as a square, rectangle (as shown), circle, oval, an undefined shape, etc. around a portion of the substrate 101. For example, the continuous trench structure 111 can border an NWELL region 121 within the substrate 101, thereby completely separating the NWELL region 121 from a surrounding PWELL region 122. The second trench 131 can comprise, for example, a linear trench structure (e.g., a rectangular-shaped trench structure, as shown in FIG. 3) or any other trench structure with a shape suitable for a deep trench capacitor.

The width 112 and depth 113 of the first trench 111 can be the same as the width 132 and depth 133 of the second trench 131, as illustrated in FIG. 1. Alternatively, the width 112 and depth 113 of the first trench 111 can be different from the width 132 and depth 133 of the second trench 131. For example, as illustrated in FIG. 2, the width 112 of the first trench 111 can be narrower than the width 132 of the second trench 131. Additionally, the depth 113 of the first trench 111 can be less than the depth 133 of the second trench 131.

The same conformal insulator layer 151 can line both the first trench 111 and the second trench 131. This conformal insulator layer 151 can comprise, for example, a relatively thin layer of an oxide material, a nitride material, an oxynitride material, and/or a high-k dielectric material. Additionally, the same conductive material 152 can be located within the first and second trenches 111, 131 on top of the conformal insulator layer 151 and essentially filling the trenches 111, 131. This conductive material 152 can comprise, for example, a polysilicon or amorphous silicon material doped with sufficient quantities of a selected dopant in order to achieve a desired level of conductivity. Alternatively, the conductive material 152 can comprise any other suitable conductor (e.g., a conductive metal or metal alloy).

A buried capacitor plate 134 can be located within the substrate 101 adjacent to the lower portion of the second trench 131, thereby forming a deep trench capacitor 130 in which the conformal insulator layer 151 lining the second trench 131 functions as the capacitor dielectric and the conductive material 152 within the second trench 131 functions as the other capacitor plate. The buried conductive plate 134 can comprise a region of the substrate that is doped (e.g., by an implantation or outdiffuion process) with sufficient quantities of a selected dopant in order to achieve the desired level of conductivity. It should be noted that the either the same dopant or a different dopant can be used in the buried capacitor plate 134 and conductor material 152.

A shallow trench isolation (STI) structure 125 (i.e., a shallow trench filled with one or more isolation materials, for example, an oxide material, nitride material, an oxynitride material) can be located in the substrate 101 aligned above the first trench 111. This STI structure 125 can specifically be above the conductive material 152 in the first trench 111 and can extend laterally beyond the sidewalls of the first trench 111 such that it in combination with the conformal insulator layer 151 that lines the first trench 111 encapsulates (i.e., completely isolates) the conductive material 151 in the first trench 111, thereby forming the deep trench isolation structure 110. It should be noted that the isolation material in the STI structure 125 can comprise either the same isolation material in the conformal isolation layer 151 or a different isolation material.

Various devices 161-163 can be located in the substrate 101. Specifically, n-type field effect transistors (NFETs) 162 and p-type field effect transistors (PFETs) 161 (e.g., for either a logic circuit or a static random access memory (SRAM) array) can be located in PWELL 122 and NWELL 121 regions of the substrate 101, respectively. Thus, PFETs 161 and NFETs 122 will be isolated from each other by the deep trench isolation structure 110. Furthermore, at least one additional device 163 can be located in the substrate 101 adjacent to the second trench 131 and can be electrically connected to the conductive material 152 in the second trench 131. For example, this additional device 163 can comprise an additional field effect transistor that is located adjacent to the second trench 131 such that one of its source/drain regions 170 is electrically connected to the conductive material 152 in the second trench 131 (i.e., electrically connected to the conductive plate in the resulting deep trench capacitor 130), thereby creating an embedded dynamic random access memory (eDRAM) cell 140.

The electrical connection between the additional device 163 and the conductive material 152 in the second trench 131 can be achieved through a conductive strap 136. For example, as illustrated in FIGS. 1 and 2, the conductive strap 136 can be located in the top portion of the second trench 131 above the conductive material 152 and conformal insulator layer 151. It can extend laterally at least to the sidewall of the second trench 131 that is immediately adjacent to the device 163 such that the conductive strap 136 is in contact with the conductive material 152 in the second trench 131 and also in contact with the device 163 (e.g., with the source/drain region 170). The conductive strap 136 can comprise, for example, a polysilicon material doped with a dopant having a same conductivity type as the source/drain region 170 of the FET 163 and, if applicable, the same conductivity type as the conductive material 152 within the second trench 131.

It should be noted that this configuration for the conductive strap 136, as described above and shown in the FIGS. 1 and 2, is for illustration purposes only and is not meant to be limiting. Any other conductive strap configuration (e.g., a buried conductive strap) that connects a deep trench capacitor to a FET in order to create an eDRAM memory cell can, alternatively, be incorporated into the circuit structure 100. Different conductive strap configurations are well-known in the art (e.g., see U.S. Patent Application No. 2009/0184392 of Cheng et al., published on Jul. 23, 2009, assigned to International Business Machines Corporation, and incorporated herein by reference) and, thus, the details are omitted from this specification in order to allow the reader to focus on the salient aspects of the embodiments described herein.

Figure 4:
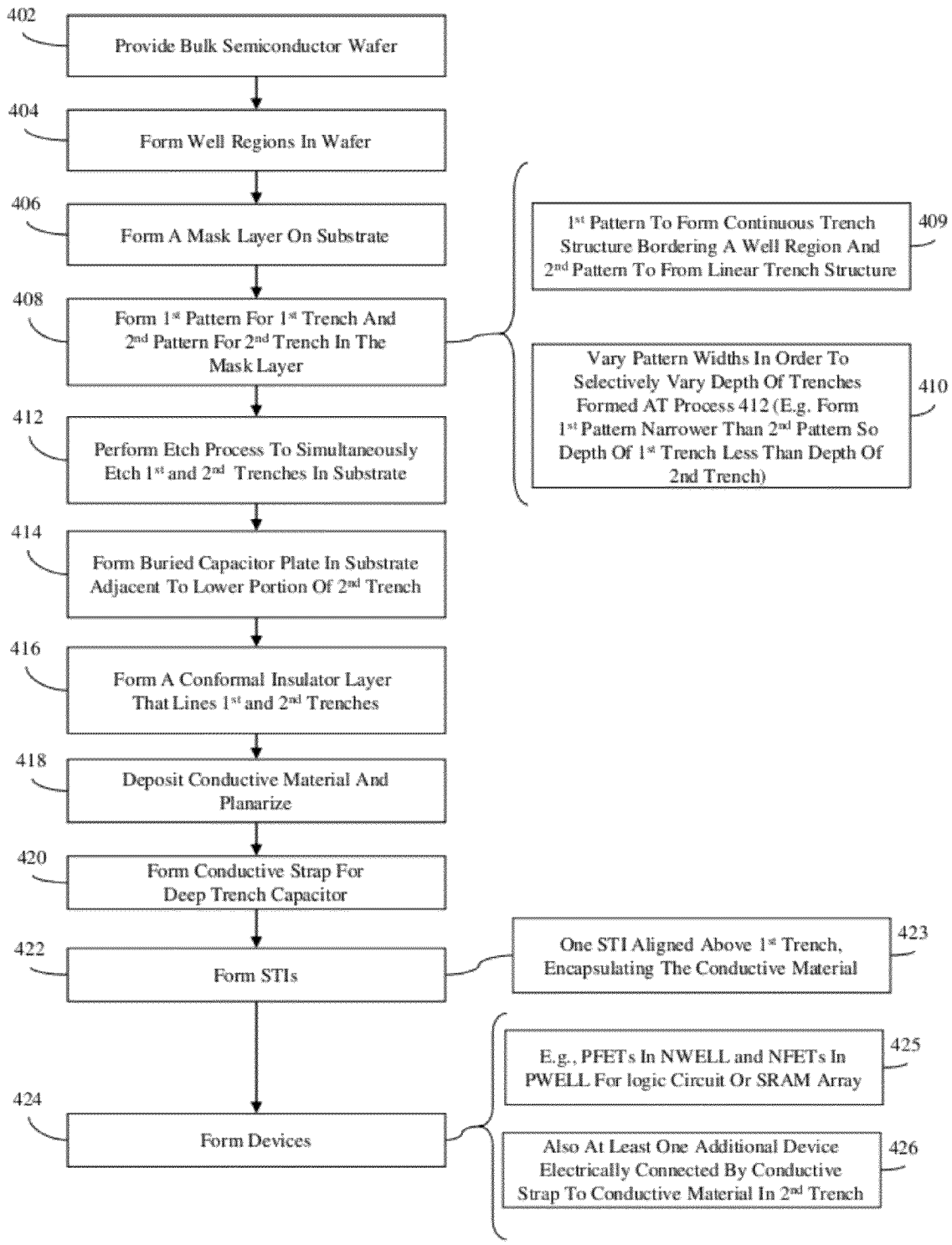
FIG. 4 is a flow diagram illustrating an embodiment of a method of forming an integrated circuit as shown in FIG. 1 or FIG. 2.

Referring to the flow diagram of FIG. 4, embodiments of a method of forming the above-described integrated circuit 100, having a deep trench isolation structure 110 and a deep trench capacitor 130 in a bulk substrate 101 (as shown in FIGS. 1 and 2), can comprise forming a first pattern and a second pattern in a mask layer on the substrate. Specifically, a bulk semiconductor wafer 101 (e.g., a P-silicon wafer) can be provided and well regions for different type devices (e.g., NWELL regions 121 for p-type devices and PWELL regions 122 for n-type device) can be formed (e.g., implanted) into the substrate (402-404, see FIG. 5).

A mask layer 500 can be formed above the substrate 101 (406). Then, conventional lithographic techniques can be used to form a first pattern 501 and a second pattern 502 in the mask layer 500 (408, see FIG. 5). The first pattern 501 can be designed for a first trench that will be used in the formation of a deep trench isolation structure (e.g., a deep trench isolation structure that will isolate the NWELL region 121 from the PWELL region 122 in either a logic circuit or a static random access memory (SRAM) array). The second pattern 502 can be designed for a second trench that will be used in the formation of a deep trench capacitor (e.g., a deep trench capacitor that will be incorporated as a storage node in an embedded dynamic random access memory (eDRAM) cell).

Figure 6:
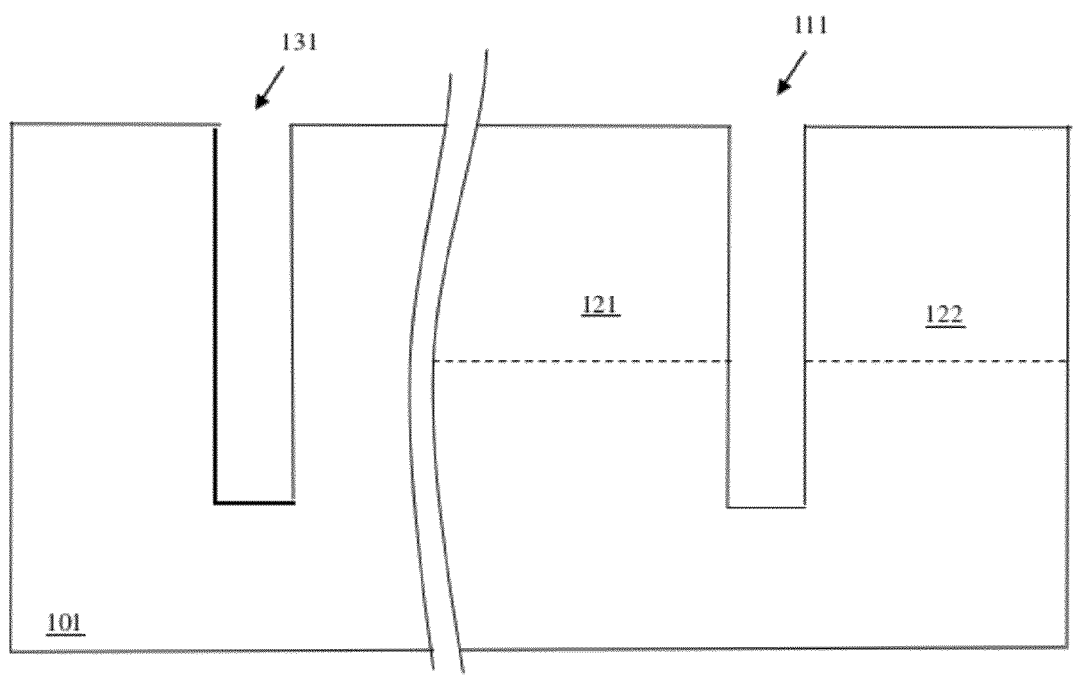
FIG. 6 is a cross-section diagram illustrating a partially completed integrated circuit formed according to the method of FIG. 4.

Next, using the patterned mask layer 500, a single anisotropic etch process can be performed in order to essentially simultaneously form both a first trench 111 and the second trench 131 in the substrate 101 and the mask layer 500 can then be removed (412, see FIG. 6). This anisotropic etch process can comprise a reactive ion etch (RIE) process or other suitable etch process capable of forming deep trenches within the semiconductor substrate 101.

Figure 7:
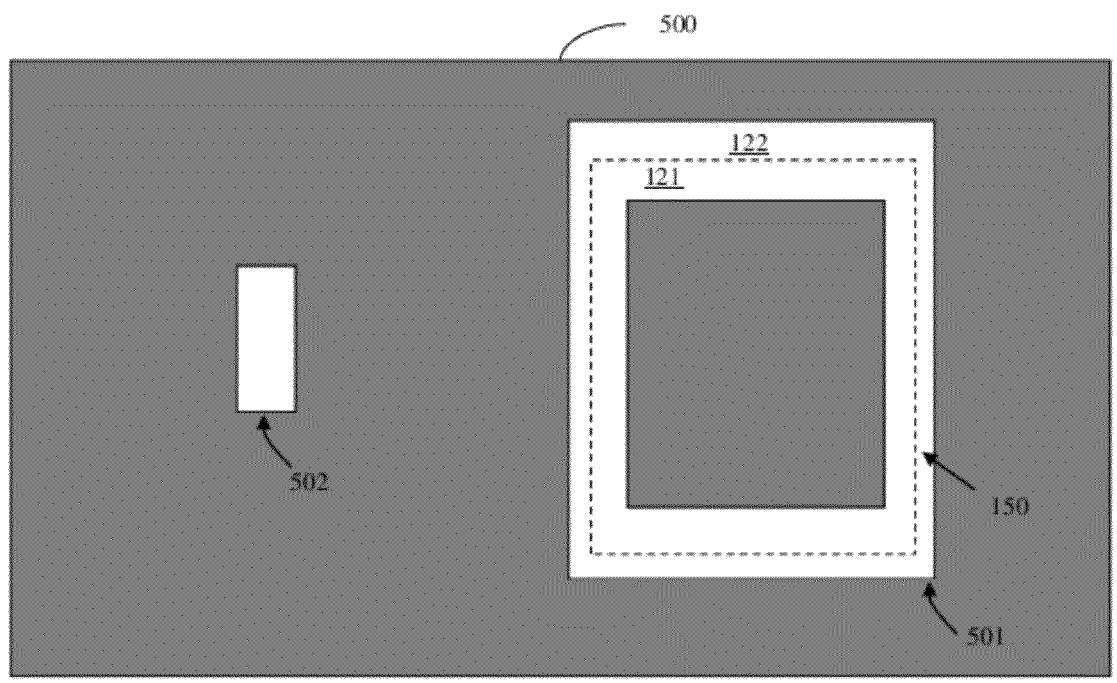
FIG. 7 is a top view diagram illustrating the partially completed integrated circuit of FIG. 5.

It should be noted that the first pattern 501 can be formed (at process 408) as a continuous pattern (i.e., a pattern without a beginning or end) that forms a shape such as a square, rectangle (as shown in FIG. 7), circle, oval, an undefined shape, etc. (409). For example, this first pattern 501 can be formed so that it is aligned above a border 150 in the substrate 101 between a well region (e.g., the NWELL 121 region) and another well region which surrounds it (e.g., the PWELL 122 region). Consequently, as illustrated in FIG. 3, once the first and second trenches 111, 131 are etched (at process 412), the first trench 111 can comprise a continuous trench structure (i.e., a trench structure without a beginning or end) that essentially forms a moat having a particularly shape, such as a square, rectangle (as shown), circle, oval, an undefined shape, etc. around a portion of the substrate 101 or, more particularly, around a well region (e.g., NWELL region 121) in the substrate 101 such that it is positioned between the well region (e.g., the NWELL region 121) and another well region (e.g., the PWELL region 122) which surrounds it. Additionally, the second pattern 502 should be formed (at process 408) as a linear pattern (e.g., a rectangular-shaped pattern, as shown in FIG. 7) or as a pattern with any other shape suitable for a deep trench capacitor, as determined by the circuit designer(s), such that once the first and second trenches 111, 131 are etched (at process 412) the second trench 131 will comprise the desired trench structure (e.g., a linear trench structure) (409).

Figure 5:
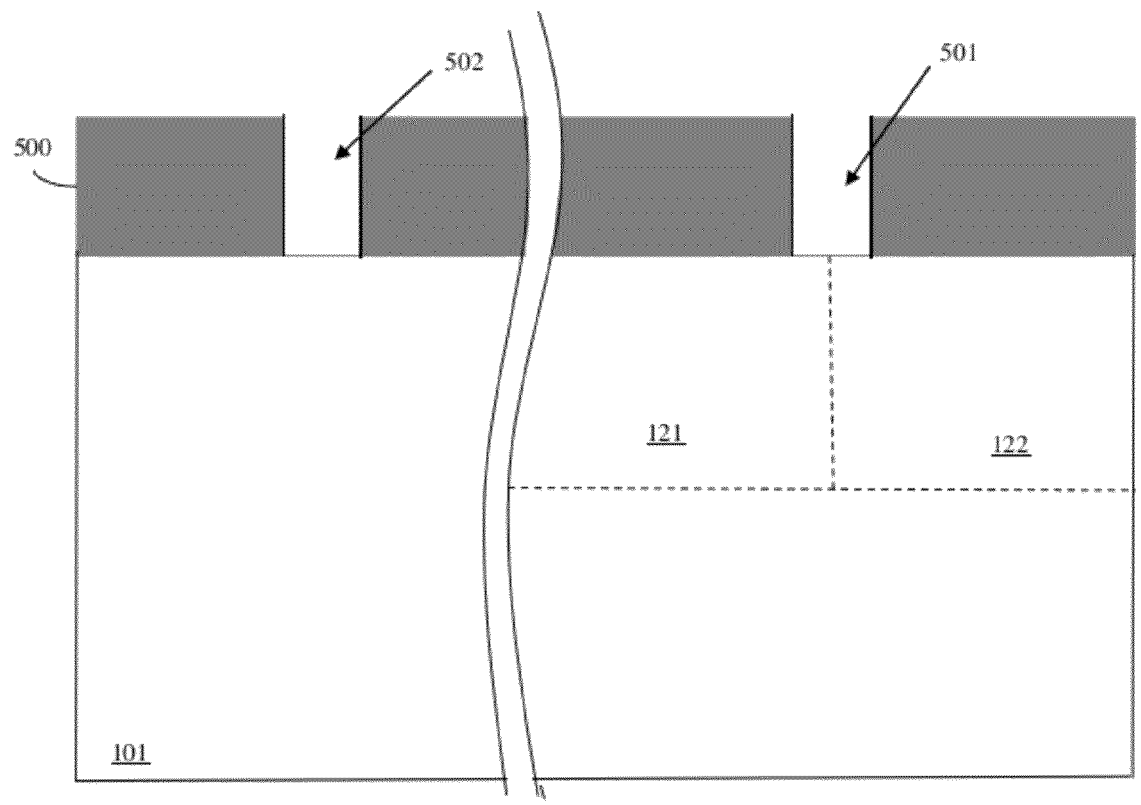
FIG. 5 is a cross-section diagram illustrating a partially completed integrated circuit formed according to the method of FIG. 4.
Figure 8:
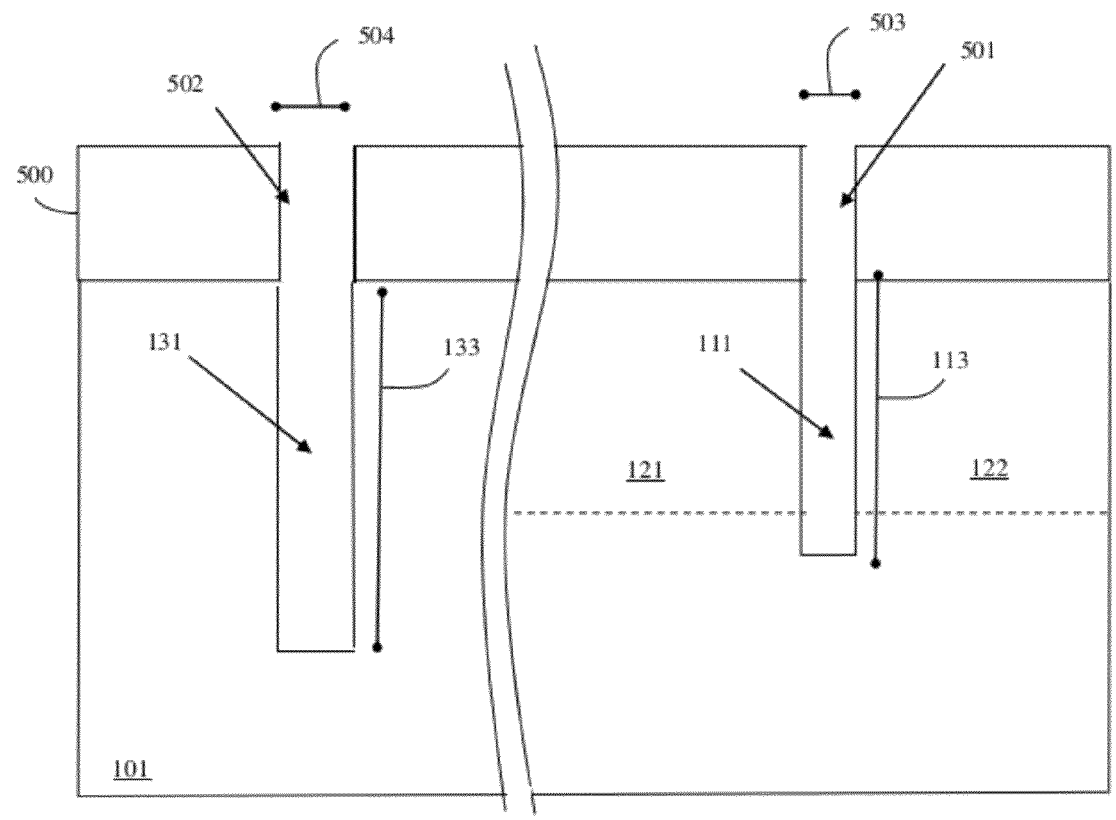
FIG. 8 is a cross-section diagram illustrating a partially completed integrated circuit formed according to the method of FIG. 4.
Figure 9:
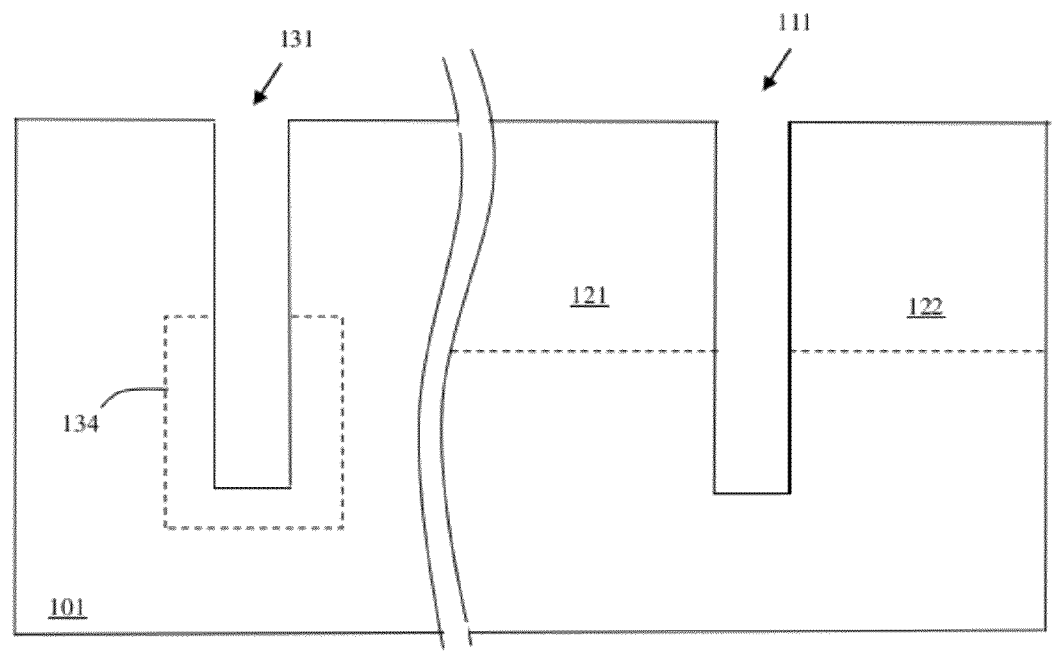
FIG. 9 is a cross-section diagram illustrating a partially completed integrated circuit formed according to the method of FIG. 4.

It should also be noted that the widths of the first and second patterns 501 and 502 that are formed (at process 408) can be varied in order to selectively vary the resulting depths of the first and second trenches 111, 131 following the anisotropic etch (at process 412) (410). Specifically, the different depths, to which the first and second trenches 111, 131 will etch to, are dependent upon the aspect ratio of the trench openings created by the patterns at the top surface of the substrate 101. During the same anisotropic etch process, same size pattern openings will result in trenches have the same depth (as shown in FIGS. 5 and 6). However, a wider opening will result in a deeper trench and vice versa. For example, if the first pattern 501 is formed (at process 408) such that it has a width 503 that is narrower than the width 504 of the second pattern 502, then following the anisotropic etch (at process 412), the first trench 111 will have a depth 113 that is less than the depth 133 of the second trench 131 (see FIG. 8). For illustration purposes, the remaining process steps are illustrated with respect to the embodiment of FIG. 1 in which the first and second trenches 111, 131 have approximately equal depths 113, 133. However, it should be understood that each of these process steps would also apply to the formation of the embodiment of FIG. 2 in which the first and second trenches 111, 131 have different depths 113, 133.

Once the trenches 111, 131 are formed (at process 412), the first trench 111 is masked (not shown) and a buried capacitor plate 134 for the deep trench capacitor can be formed in the substrate 101 adjacent to the lower portion of the second trench 131 (414,). Techniques for forming buried capacitor plates are well-known in the art and include, but are not limited to, implantation and out-diffusion techniques (e.g., see U.S. Pat. No. 6,271,142 of Gruening et al., issued on Aug. 7, 2001, assigned to International Business Machines Corporation and incorporated herein by reference). Thus, the details of such techniques are omitted from this specification in order to allow the reader to focus on the salient aspects of the embodiments described herein. Once the buried capacitor plate 134 is formed, the mask over the first trench 111 is removed.

Figure 10:
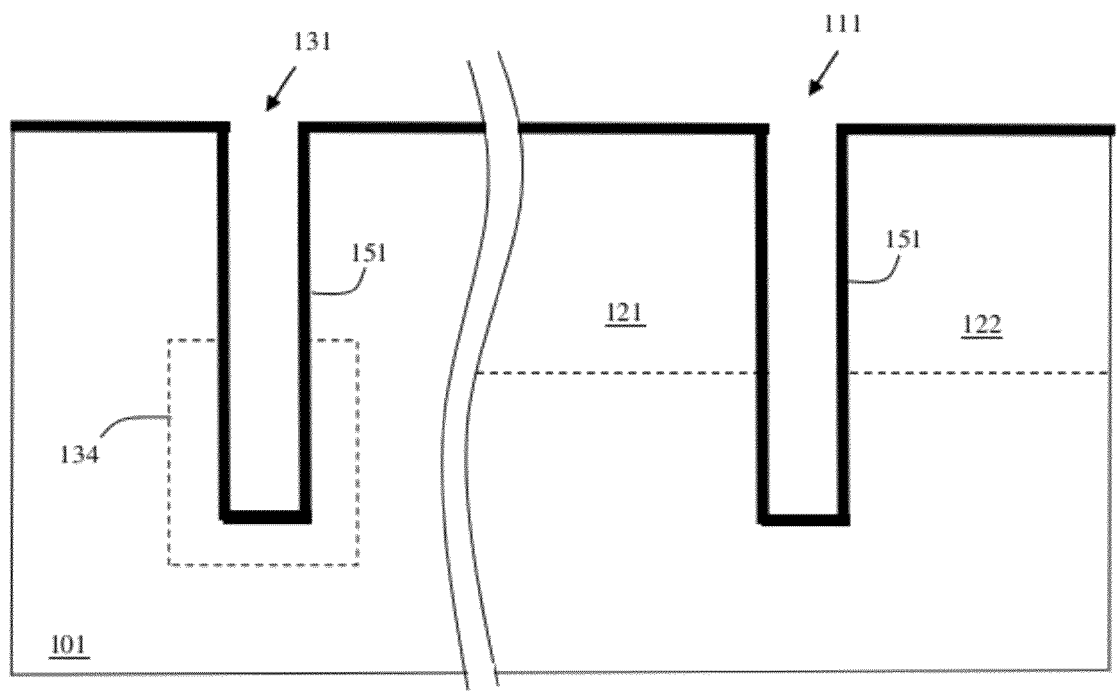
FIG. 10 is a cross-section diagram illustrating a partially completed integrated circuit formed according to the method of FIG. 4.

Then, a conformal insulator layer 151 can be formed in order to essentially simultaneously line both the first and second trenches 111, 131 (416, see FIG. 10). For example, a conformal layer of an insulator material (e.g., an oxide material, a nitride material, an oxynitride material, and/or a high-k dielectric material) can be formed on the sidewalls and bottom surfaces of the trenches 111, 131 using any suitable process (e.g., thermal oxidation, thermal nitridation, atomic layer deposition, chemical vapor deposition, etc.).

Figure 11:
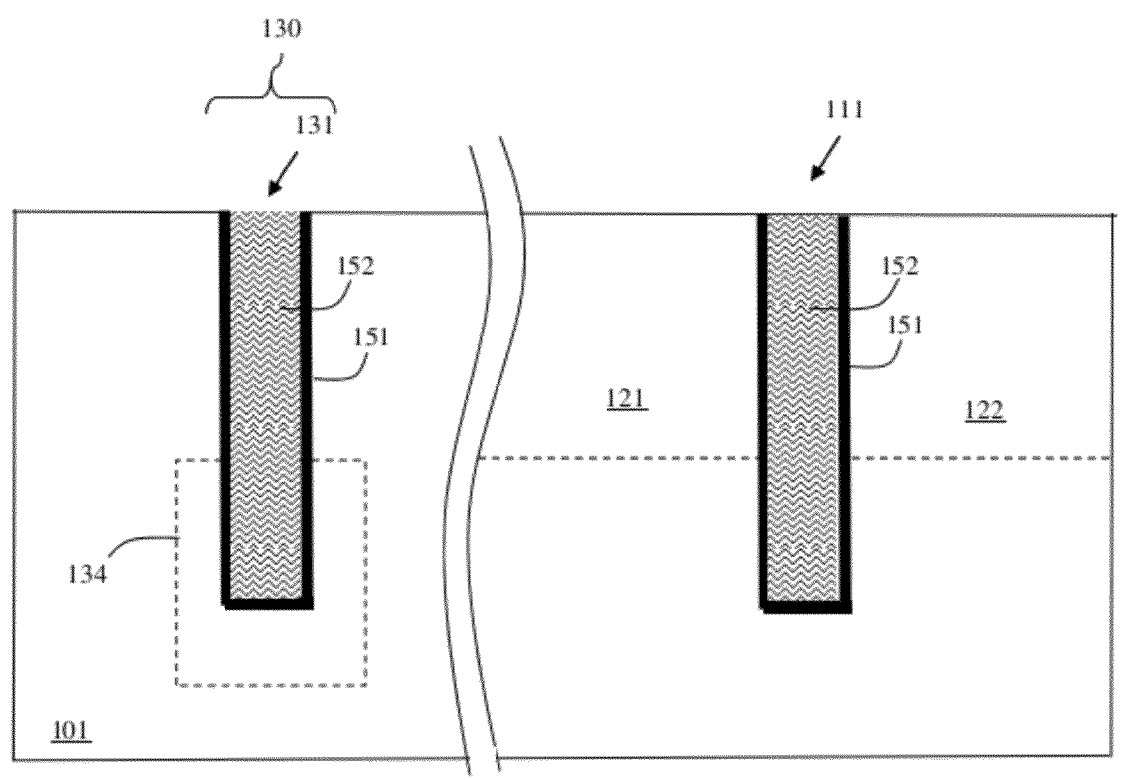
FIG. 11 is a cross-section diagram illustrating a partially completed integrated circuit formed according to the method of FIG. 4.

Next, a blanket layer of conductive material 152 can be deposited onto the conformal insulator layer 151 and, then, planarized in order to essentially simultaneously fill both the first trench 111 and the second trench 131 (418, see FIG. 11). Thus, for the deep trench capacitor 130, the conformal insulator layer 151 lining the second trench 131 functions as the capacitor dielectric and the conductive material 152 within the second trench 131 functions as a capacitor plate in addition to the buried capacitor plate 134.

Figure 12:
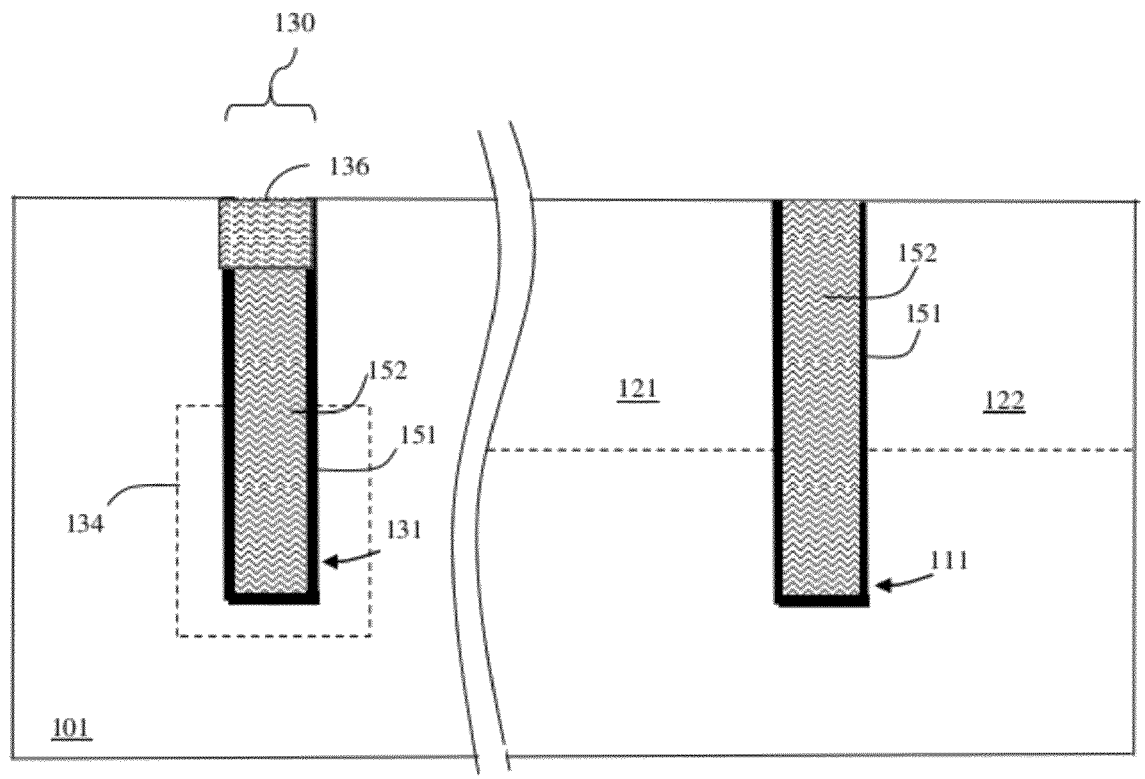
FIG. 12 is a cross-section diagram illustrating a partially completed integrated circuit formed according to the method of FIG. 4.

After the trenches 111, 131 are filled (at process 418), a conductive strap 136 can be formed that electrically connects the conductive material 152 in the second trench 131 to a portion of the substrate 101 immediately adjacent to the second trench 131 (420, see FIG. 12). This conductive strap 136 will allow the conductive material 152 within the second trench 131 (i.e., the inner conductive plate within the deep trench capacitor 130) to be electrically connected to a device that will subsequently be formed (at process 424) within that portion of the substrate 101. The conductive strap 136 can be formed, for example, by first masking the first trench 131. Then, the conductive material 152 within the top portion of the second trench 131 can be recessed. After the conductive material is recessed, any exposed conformal insulator layer 151 on the upper sidewalls of the second trench 131 can be selectively removed. Next, an additional layer of conductive material (e.g., a doped polysilicon) can be deposited on top of the conductive material 152 to re-fill the second trench 131, thereby forming the conductive strap 136. In the resulting structure, the conductive strap 136 is located in the top portion of the second trench above the conductive material 152 and conformal insulator layer 151 and is in contact with the portion of the substrate immediately adjacent to the upper sidewalls of the second trench 131.

It should be noted that the above-described technique for forming a conductive strap 136 is described herein for illustration purposes only and not intended to be limiting. Any other suitable technique for forming a conductive strap that will connect a deep trench capacitor to a FET in order to create an eDRAM memory cell (e.g., a buried conductive strap) can, alternatively, be employed. Different techniques for forming such conductive straps are well-known in the art (e.g., see U.S. Patent Application No. 2009/0184392 of Cheng et al., published on Jul. 23, 2009, assigned to International Business Machines Corporation, and incorporated herein by reference) and, thus, the details are omitted from this specification in order to allow the reader to focus on the salient aspects of the embodiments described herein.

Figure 13:
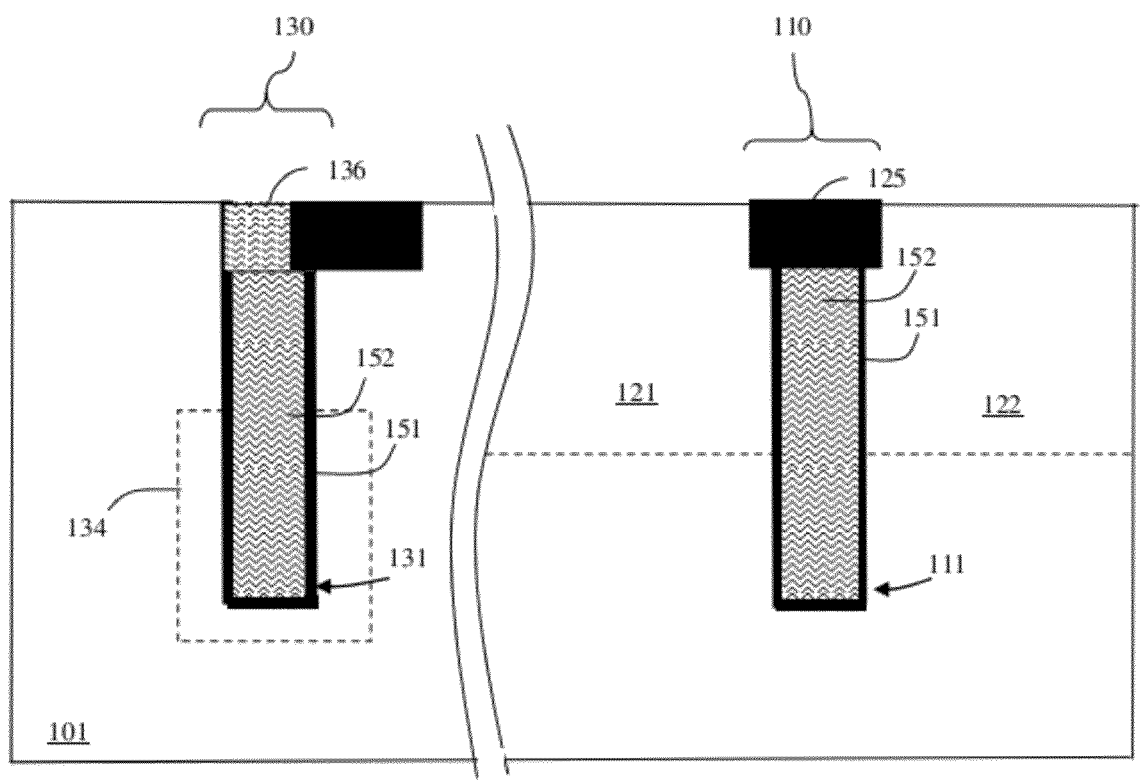
FIG. 13 is a cross-section diagram illustrating a partially completed integrated circuit formed according to the method of FIG. 4.

Additionally, using conventional processing techniques, shallow trench isolation (STI) structures can be formed at the top surface of the substrate 101 in order to define the various device regions of the substrate 101 (422). During this STI formation process, at least one STI structure 125 can be formed such that it is located in the substrate 101 aligned above the first trench 101 (see FIG. 13). Specifically, the STI structure 125 can be formed such that it is positioned above the conductive material 152 in the first trench 111 and further such that it extends laterally beyond the sidewalls of the first trench 111. Thus, the STI 125 in combination with the conformal insulator layer 151 that lines the first trench 111 will encapsulate (i.e., completely isolates) the conductive material 152 and, thereby complete the deep trench isolation structure 110 (423). It should be noted that the isolation material in the STI structure 125 can comprise either the same isolation material in the conformal isolation layer 151 or a different isolation material.

Finally, using convention processing techniques, devices (e.g., 161-163) can be formed in the substrate 101 adjacent to the first and second trenches 111, 131 (424, see FIGS. 1 and 2). Specifically, n-type field effect transistors (NFETs) 162 and p-type field effect transistors (PFETs) 162 (e.g., for either a logic circuit or a static random access memory (SRAM) array) can be formed in PWELL 122 and NWELL 121 regions of the substrate 101, respectively. Thus, the PFETs 161 and NFETs 162 will be isolated from each other by the deep trench isolation structure 110. Furthermore, at least one additional device 163 can be formed in the substrate 101 adjacent to the second trench 131 such that it is electrically connected (e.g., by the conductive strap 136) to the conductive material 152 in the second trench 131. For example, this additional device 163 can comprise an additional field effect transistor that is formed adjacent to the second trench 131 such that one of its source/drain regions 170 is electrically connected (e.g., by the conductive strap 136) to the conductive material 152 in the second trench 131 (i.e., electrically connected to the inner conductive plate in the resulting deep trench capacitor 130), thereby creating an embedded dynamic random access memory (eDRAM) cell 140. It should be noted that if the conductive strap 136 is a doped polysilicon, it should be formed at process 420 such that it will have the same conductivity type as the source/drain region 170.

Figure 14:
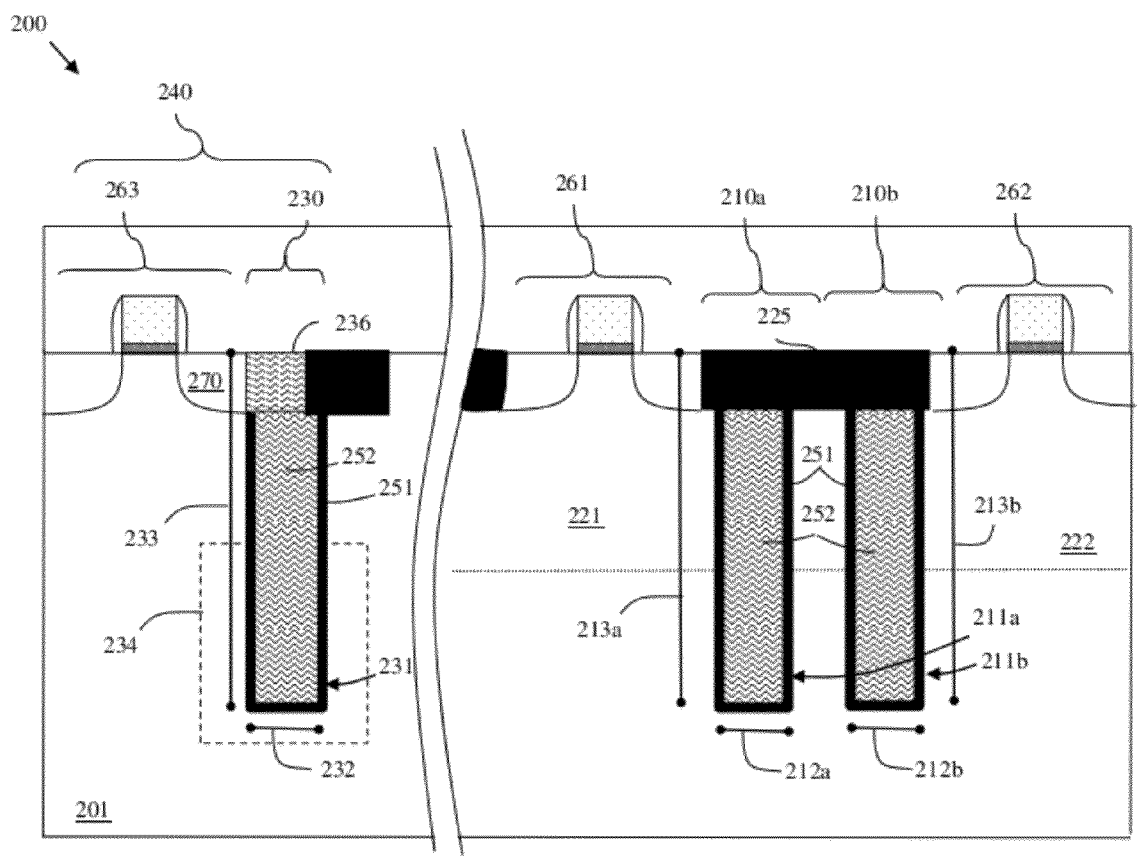
FIG. 14 is a cross-section diagram illustrating another embodiment of an integrated circuit.
Figure 15:
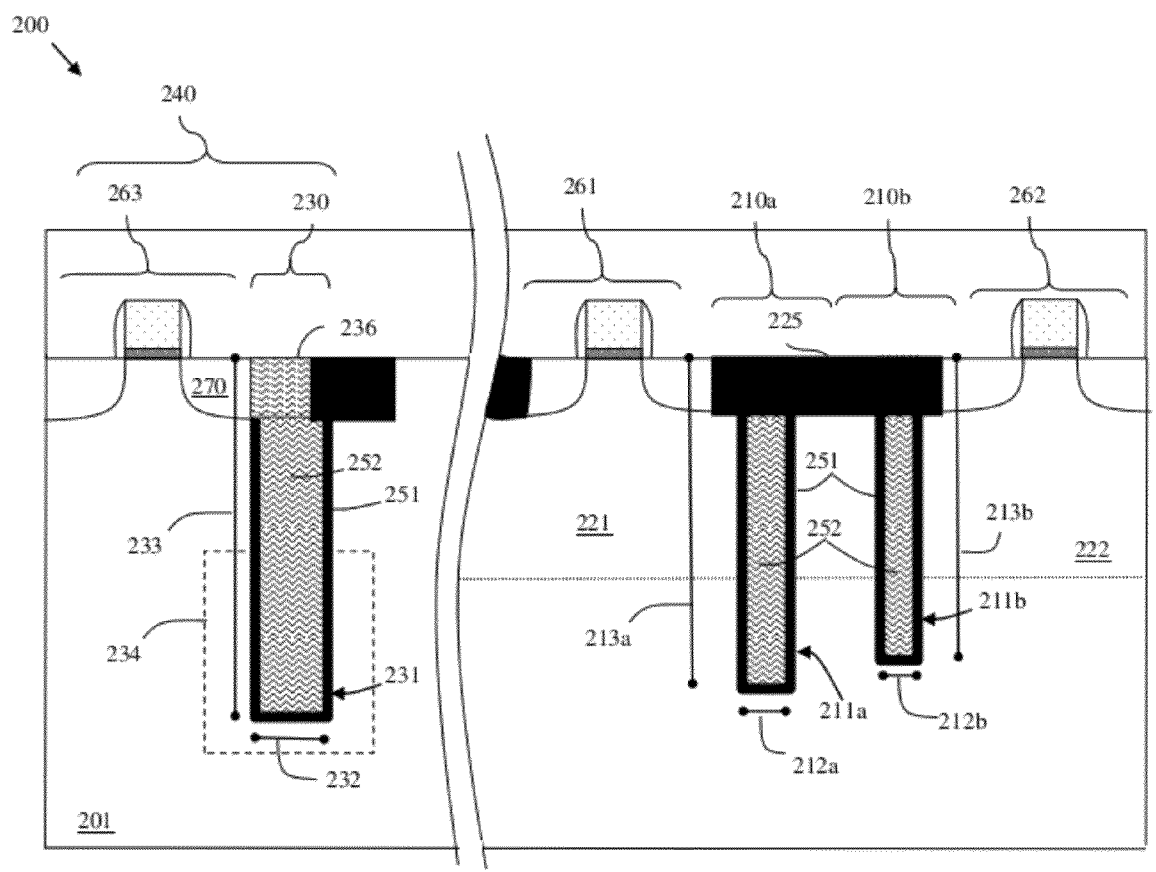
FIG. 15 is a cross-section diagram illustrating yet another embodiment of an integrated circuit.

Referring to FIGS. 14 and 15, also disclosed are embodiments of an integrated circuit 200 having, in a bulk substrate, multiple adjacent deep trench isolation structures 210a-b and a deep trench capacitor 230. The deep trench isolation structures 210a-b can, for example, isolate an NWELL region 221 from a surrounding PWELL region 222 in a logic circuit or a static random access memory (SRAM) array. The deep trench capacitor 230 can, for example, be incorporated into an embedded dynamic random access memory (eDRAM) cell 240.

Specifically, the integrated circuit 200 can comprise a substrate 201 (e.g., a bulk silicon substrate, such as a P-substrate). It can further comprise, in the substrate 101, at least multiple adjacent first trenches 211a-b for multiple adjacent deep trench isolation structures 210a-b and a second trench 231 for the deep trench capacitor 230. For illustration purposes, the integrate circuit 200 is shown in FIGS. 14 and 15 as having two adjacent first trenches 211a-b for two adjacent deep trench isolation structures 210a-b. However, it should be understood that the embodiment can comprise any number of such first trenches as required to achieve the desired isolation.

Figure 16:
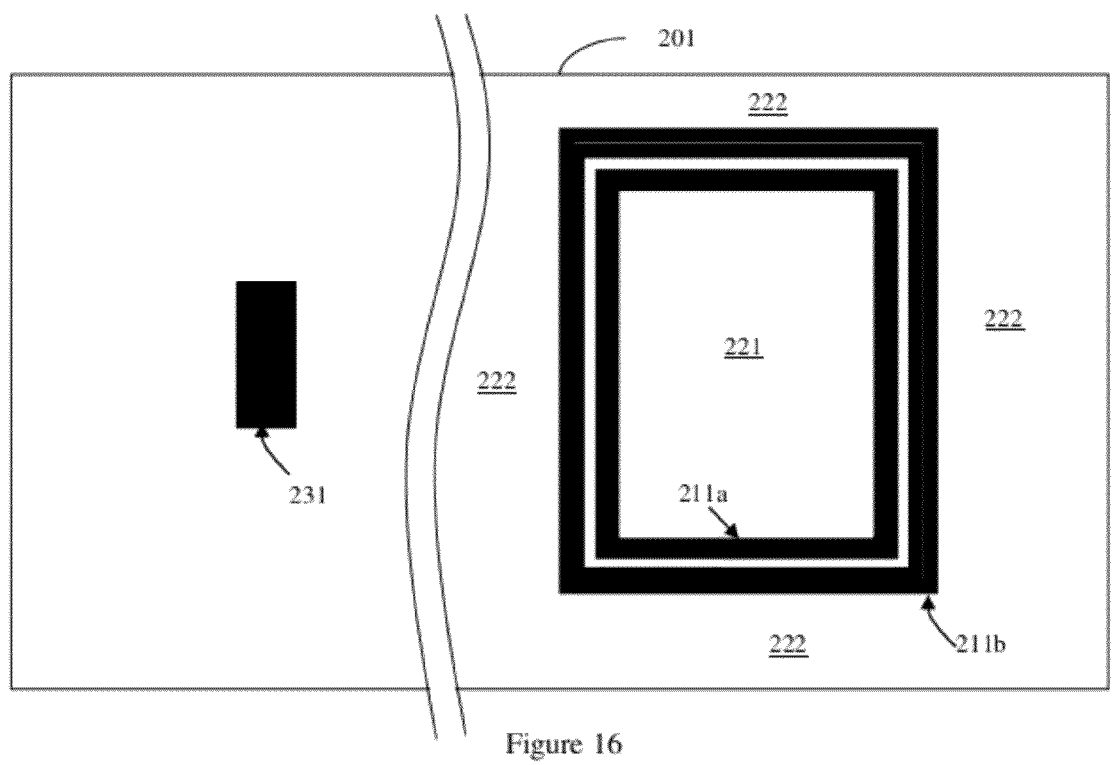
FIG. 16 is a top view diagram illustrating an exemplary layout for the trenches 211a, 211b and 231 of FIG. 14 or FIG. 15.

As illustrated in FIG. 16, the first trenches can comprise a continuous trench structure 21 1a (i.e., a structure without a beginning or end) that essentially forms a moat in a given shape, such as a square, rectangle (as shown), circle, oval, undefined shape, etc., around a portion of the substrate 101. For example, this continuous trench structure 211a can be patterned so that it borders a given well region (e.g., NWELL region 221) within the substrate 101, completely separating it from a surrounding well region (e.g., PWELL region 221). The first trenches can further comprise at least one additional continuous trench structure 211b adjacent to an outside edge of the continuous trench structure 211a and having approximately the same patterned shape. In other words, the first trench 211b surrounds the first trench 211a in an essentially concentric pattern. The second trench 231 can comprise, for example, a linear trench structure (e.g., a rectangular shaped trench structure, as shown in FIG. 16) or trench structure with any other shape suitable for a deep trench capacitor.

The widths 212a-b and depths 213a-b of the first trenches 211a-b can be the same as the width 232 and depth 233 of the second trench 231, as illustrated in FIG. 14. Alternatively, the widths 212a-b and depths 213a-b of the first trenches 211a-b can be different from each other and/or different from the width 232 and depth 233 of the second trench 231. For example, as illustrated in FIG. 15, the width 212b of the first trench 211b can be narrower than the width 212a of the first trench 211a, which in turn can be narrower than the width 232 of the second trench 231. Additionally, the depth 213b of the first trench 211b can be less than the depth 213a of the first trench 211a, which in turn can be less than the depth 233 of the second trench 231.

The same conformal insulator layer 252 can line each of the trenches 211a-b, 231. This conformal insulator layer 251 can comprise, for example, a relatively thin layer of an oxide material, a nitride material, an oxynitride material, and/or a high-k dielectric material. Additionally, the same conductive material 252 can be located within each of the trenches 211a-b, 231 on top of the conformal insulator layer 251 and essentially filling the trenches 211a-b, 231. This conductive material 252 can comprise, for example, a polysilicon or amorphous silicon material doped with sufficient quantities of a selected dopant in order to achieve a desired level of conductivity. Alternatively, the conductive material 252 can comprise any other suitable conductor (e.g., a conductive metal or metal alloy).

A buried capacitor plate 234 can be located within the substrate 201 adjacent to the lower portion of the second trench 231, thereby forming a deep trench capacitor 230 in which the conformal insulator layer 251 lining the second trench 231 functions as the capacitor dielectric and the conductive material 252 within the second trench 231 functions as the other capacitor plate. The buried conductive plate 234 can comprise a region of the substrate 101 that is doped (e.g., by an implantation or outdiffuion process) with sufficient quantities of a selected dopant in order to achieve the desired level of conductivity. It should be noted that the either the same dopant or a different dopant can be used in the buried capacitor plate 234 and conductor material 252.

At least one shallow trench isolation (STI) structure 225 (i.e., a shallow trench filled with one or more isolation materials, for example, an oxide material, nitride material, an oxynitride material) can be located in the substrate 201 aligned above the first trenches 211a-b. Specifically, a single STI structure 225 can be located above both first trenches 211a-b, as shown. Alternatively, discrete STI structures can be located above each first trench 211a-b. The STI structure(s) 225 can be positioned above the conductive material 252 in the first trenches 211a-b and can extend laterally beyond the sidewalls of the first trenches 111 such that it/they in combination with the conformal insulator layer 251 that lines the first trenches 211a-b encapsulates (i.e., completely isolates) the conductive material 251 within each of the first trenches 211a-b, thereby forming the adjacent deep trench isolation structures 210a-b. It should be noted that the isolation material in the STI structure(s) 225 can comprise either the same isolation material in the conformal isolation layer 151 or a different isolation material.

Various devices 261-263 can be located in the substrate 201. Specifically, n-type field effect transistors (NFETs) 262 and p-type field effect transistors (PFETs) 261 (e.g., for either a logic circuit or a static random access memory (SRAM) array) can be located in PWELL 222 and NWELL 221 regions of the substrate 201, respectively. Thus, PFETs 261 and NFETs 222 will be isolated from each other by the adjacent deep trench isolation structures 210a-b. Furthermore, at least one additional device 263 can be located in the substrate 201 adjacent to the second trench 231 and electrically connected to the conductive material 252 in the second trench 231. For example, this additional device 263 can comprise an additional field effect transistor that is located adjacent to the second trench 231 such that one of its source/drain regions 270 is electrically connected to the conductive material 252 in the second trench 231 (i.e., electrically connected to the conductive plate in the resulting deep trench capacitor 230), thereby creating an embedded dynamic random access memory (eDRAM) cell 240.

The electrical connection between the additional device 263 and the conductive material 252 in the second trench 231 can be achieved through a conductive strap 236. For example, as illustrated in FIGS. 14 and 15, the conductive strap 236 can be located in the top portion of the second trench 231 above the conductive material 252 and conformal insulator layer 251. It can extend laterally at least to the sidewall of the second trench 231 that is immediately adjacent to the device 263 such that the conductive strap 236 is in contact with the conductive material 252 in the second trench 231 and also in contact with the device 263 (e.g., with the source/drain region 270). The conductive strap 236 can comprise, for example, a polysilicon material doped with a dopant having a same conductivity type as the source/drain region 270 of the FET 263 and, if applicable, the same conductivity type as the conductive material 252 within the second trench 231.

It should be noted that the configuration for the conductive strap 236 is described above and shown in the FIGS. 14 and 15 for illustration purposes only and is not intended to be limiting. Any other conductive strap configuration (e.g., a buried conductive strap) that connects a deep trench capacitor to a FET in order to create an eDRAM memory cell can, alternatively, be incorporated into the circuit structure 100. Different conductive strap configurations are well-known in the art (e.g., see U.S. Patent Application No. 2009/0184392 of Cheng et al., published on Jul. 23, 2009, assigned to International Business Machines Corporation, and incorporated herein by reference) and, thus, the details are omitted from this specification in order to allow the reader to focus on the salient aspects of the embodiments described herein.

Figure 17:
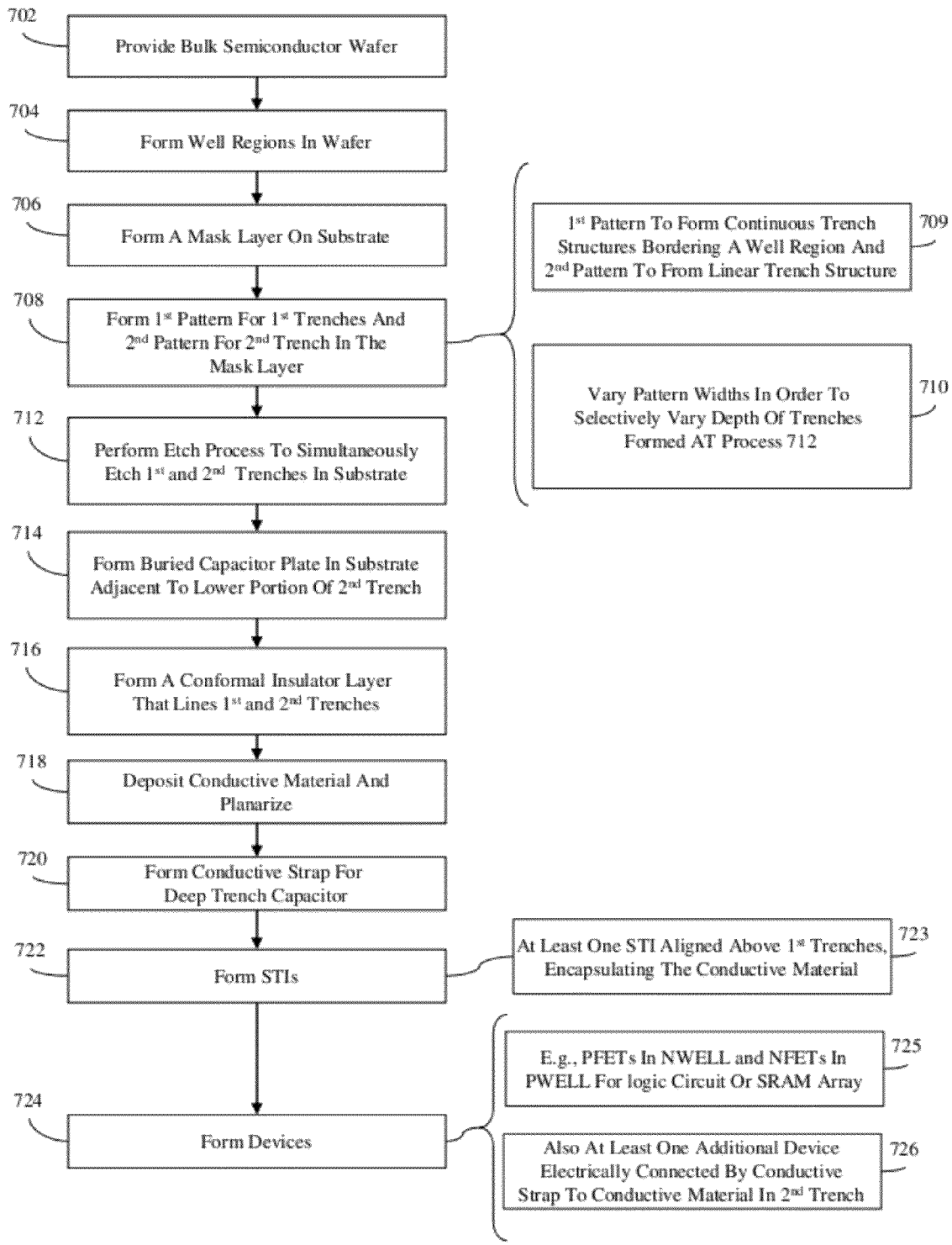
FIG. 17 is a flow diagram illustrating an embodiment of a method of forming an integrated circuit as shown in FIG. 14 or FIG. 15.

Referring to the flow diagram of FIG. 17, embodiments of a method of forming the above-described integrated circuit 200, having multiple adjacent deep trench isolation structures and a deep trench capacitor in a bulk substrate (as shown in FIGS. 14 and 15), can comprise forming a first pattern and a second pattern in a mask layer on the substrate. Specifically, a bulk semiconductor wafer 201 (e.g., a P-silicon wafer) can be provided and well regions for different type devices (e.g., NWELL regions 221 for p-type devices and PWELL regions 222 for n-type device) can be formed (e.g., implanted) into the substrate 201 (702-704, see FIG. 18).

A mask layer 800 can be formed above the substrate 201 (406). Then, conventional lithographic techniques can be used to form a first pattern 801 and a second pattern 802 in the mask layer 800 (408, see FIG. 18). In this case, the first pattern 801 can be designed with at least two sections 801a-b for at least two adjacent first trenches that will be used in the formation corresponding deep trench isolation structures (e.g., multiple adjacent deep trench isolation structures that will isolate the NWELL region 221 from the PWELL region 222 in either a logic circuit or a static random access memory (SRAM) array). The second pattern 802 can be designed for a second trench that will be used in the formation of a deep trench capacitor (e.g., a deep trench capacitor that will be incorporated as a storage node in an embedded dynamic random access memory (eDRAM) cell).

Figure 19:
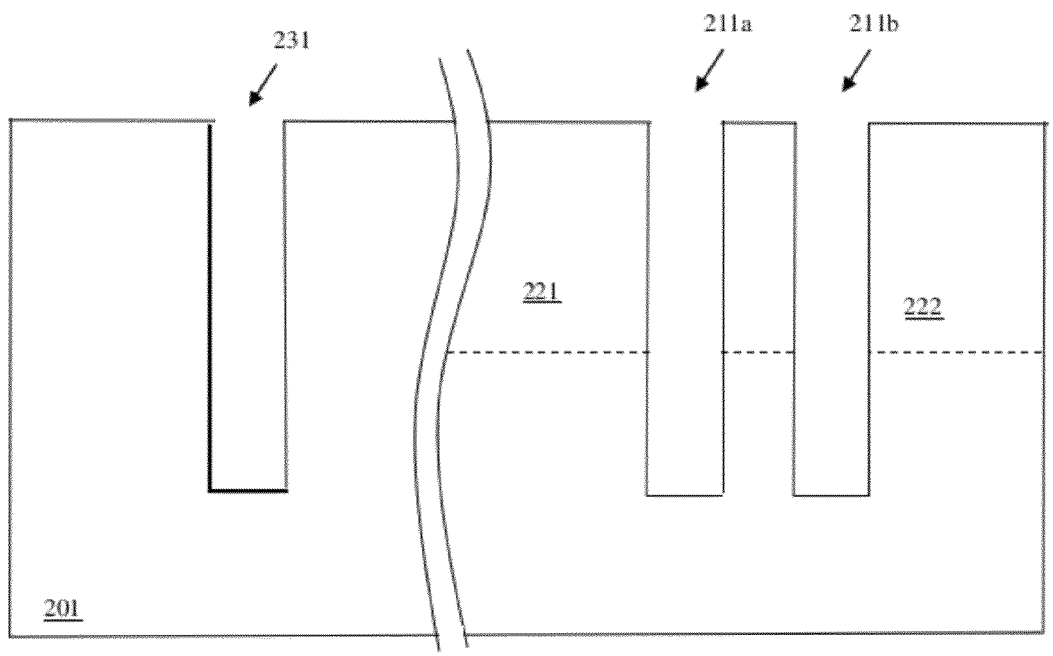
FIG. 19 is a cross-section diagram illustrating a partially completed integrated circuit formed according to the method of FIG. 17.

Next, using the patterned mask layer 800, a single anisotropic etch process can be performed in order to essentially simultaneously form both the first trenches 211a-b and the second trench 231 in the substrate 101 and the mask layer 800 can be removed (712, see FIG. 19). This anisotropic etch process can comprise a reactive ion etch (RIE) process or other suitable etch process capable of forming deep trenches within the semiconductor substrate 201.

Figure 20:
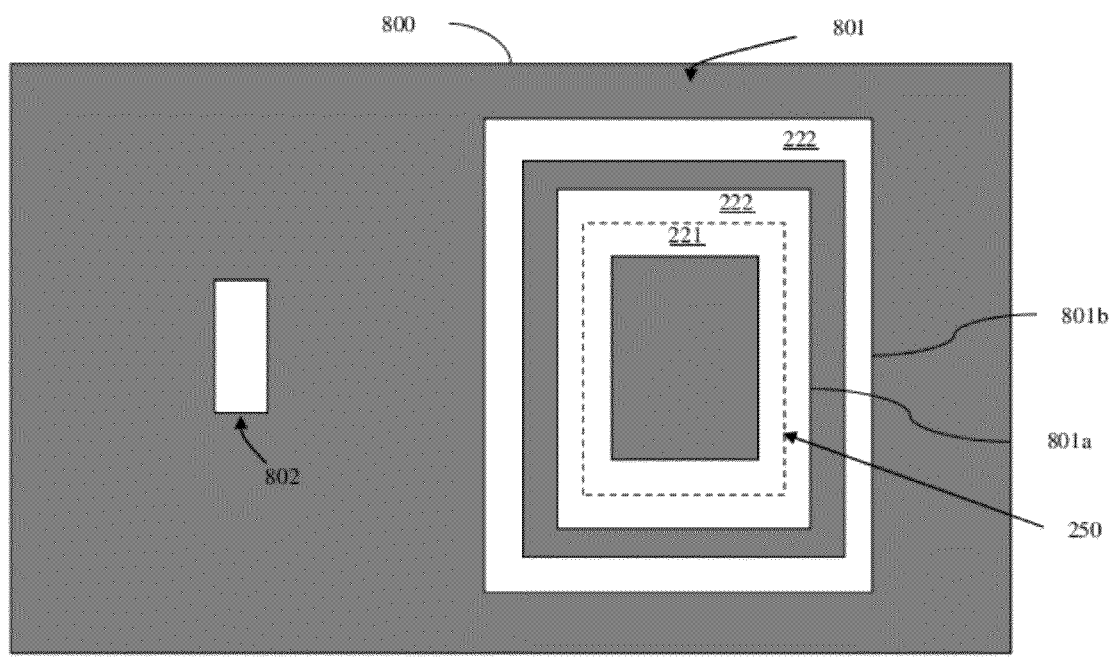
FIG. 20 is a top view diagram illustrating the partially completed integrated circuit of FIG. 18.

It should be noted that the first pattern 801 can be formed (at process 708) such that the first section 801a of the first pattern 801 is continuous (i.e., without a beginning or end) aligned above a border 250 in the substrate 201 between a well region (e.g., the NWELL 221 region) and another well region which surrounds it (e.g., the PWELL 222 region) (709). The second section 801b and any additional sections (not shown) of the first pattern 801 can be positioned adjacent the outer edge of the first section 801a in order to create an essentially concentric pattern 801. Consequently, as illustrated in FIG. 16, once the first and second trenches 211a-b, 231 are etched (at process 712), the first trench 211a will comprise a continuous trench structure (i.e., a trench structure without a beginning or end) that essentially forms a moat that has a particular shape, such as a square, rectangle (as shown), circle, oval, undefined shape, etc., and that borders a given well region (e.g., NWELL region 221) in the substrate 201 such that it is positioned between the well region (e.g., the NWELL region 221) and another well region (e.g., the PWELL region 222) which surrounds it. Additionally, the first trench 211b will comprise a continuous trench structure positioned adjacent to the outer edge of the first trench 211a and so on, creating essentially concentric trenches. Furthermore, the second pattern 802 should be formed (at process 708) as a linear pattern (e.g., a rectangular-shaped pattern, as shown in FIG. 20) or as any other pattern having a shape suitable for a deep trench capacitor 230, as determined by the circuit designer(s), such that once the first and second trenches 211a-b, 231 are etched (at process 712) the second trench 231 will comprise the desired trench structure (e.g., a linear trench structure) (709).

Figure 18:
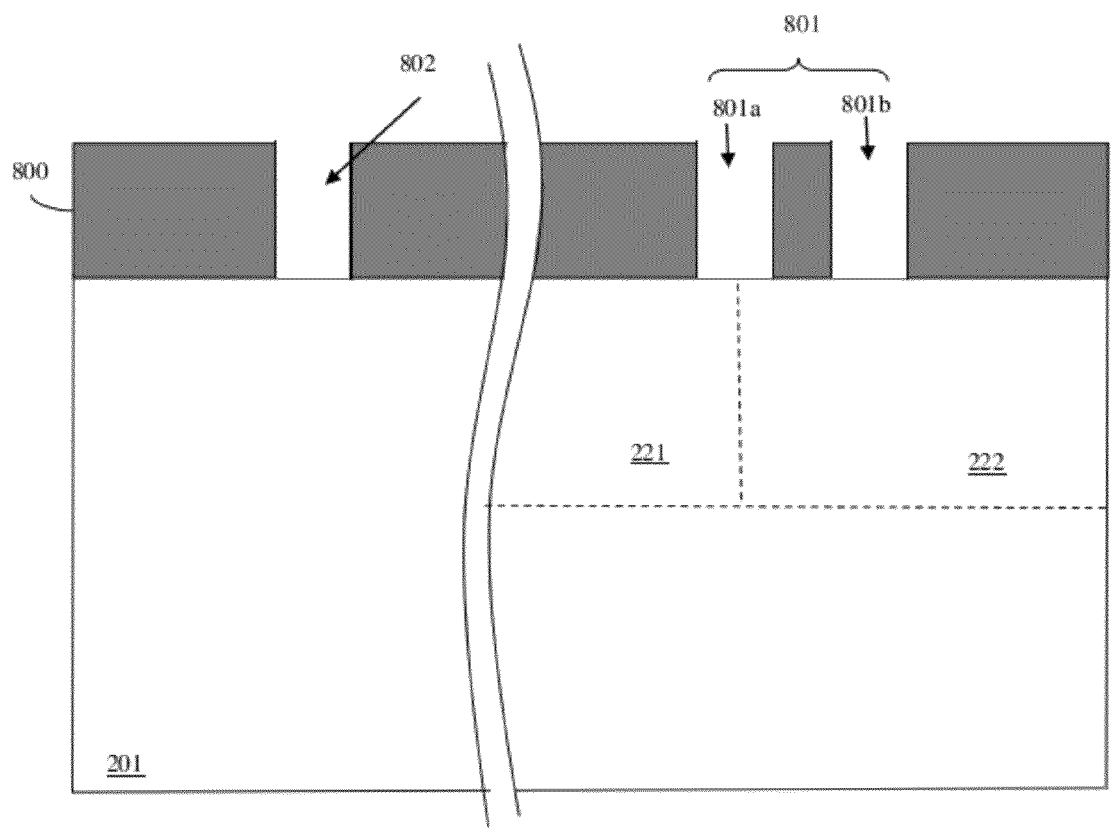
FIG. 18 is a cross-section diagram illustrating a partially completed integrated circuit formed according to the method of FIG. 17.
Figure 21:
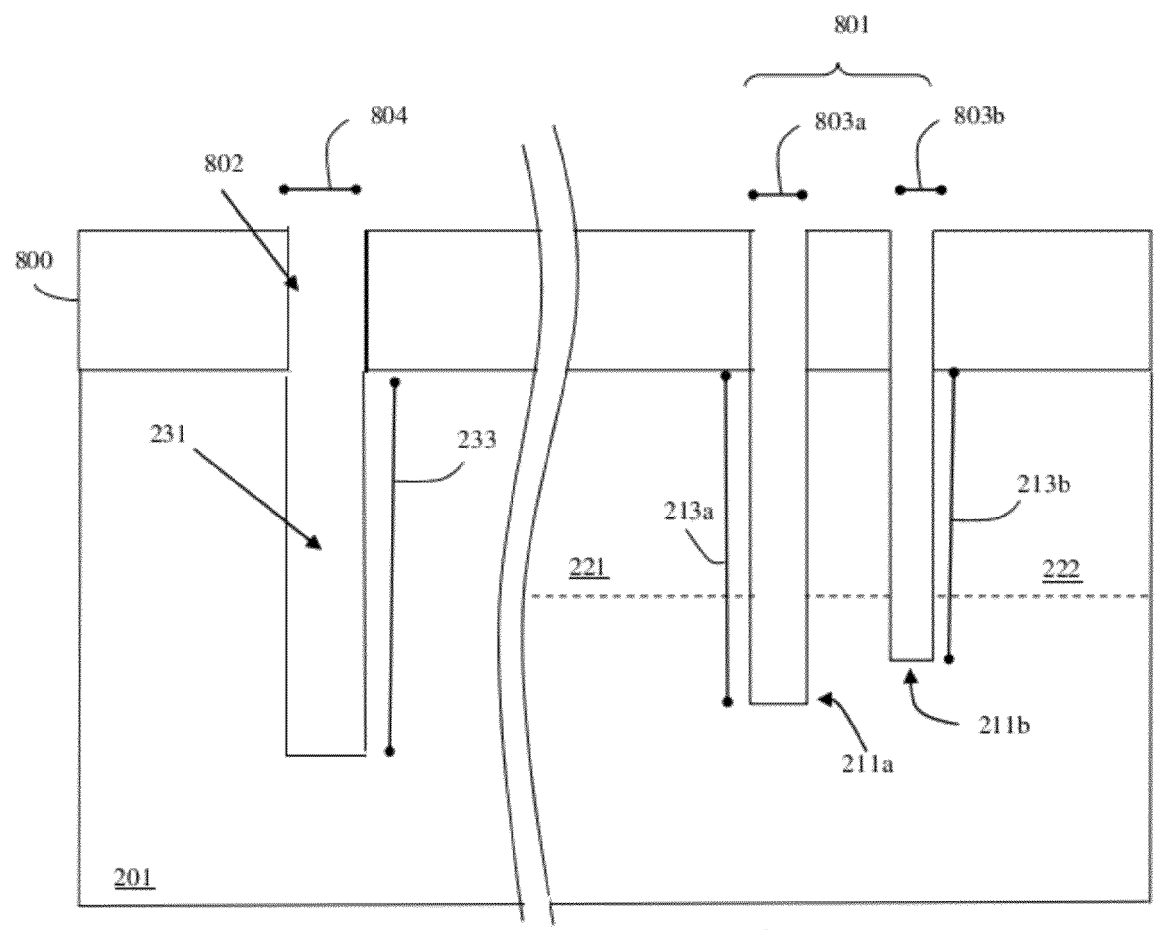
FIG. 21 is a cross-section diagram illustrating a partially completed integrated circuit formed according to the method of FIG. 17.

It should also be noted that, when the first pattern 801 and second pattern 802 are being formed (at process 708), the widths of the patterns and/or sections thereof may be selectively varied in order to selectively vary the resulting depths of the first trenches 211a-b and/or the second trench 231 following the anisotropic etch (at process 712) (710). Specifically, the depths to which the first and second trenches 211a-b, 231 will etch to are dependent upon the aspect ratio of the trench openings created by the patterns at the top surface of the substrate 201. During the same anisotropic etch process, same size pattern openings will result in trenches have the same depth (as shown in FIGS. 18 and 19). However, a wider opening will result in a deeper trench and vice versa. For example, if the first pattern 801 is formed (at process 808) such that the section 801b has a width 803b that is narrower than the width 803a of the section 801a and further such that the section 801a has a width that is narrower than the width 804 of the second pattern 802, then following the anisotropic etch (at process 712), the first trench 211b will have a depth 213b that is less than the depth 213a of the first trench 211a and the first trench 211a will have a depth 213a that is less than the depth 233 of the second trench 231 (see FIG. 21). For illustration purposes, the remaining process steps are illustrated with respect to the embodiment of FIG. 14 in which the first and second trenches 211a-b, 231 have approximately equal depths 213a-b, 233, respectively. However, it should be understood that each of these process steps would also apply to the formation of the embodiment of FIG. 15 in which trenches have different depths.

Figure 22:
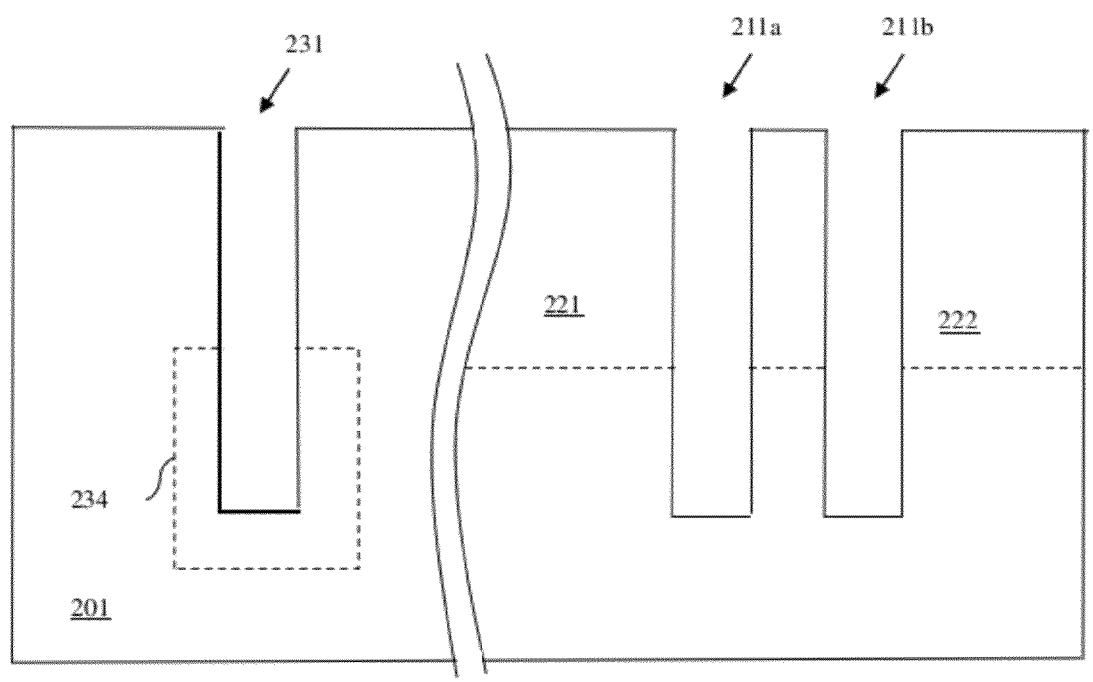
FIG. 22 is a cross-section diagram illustrating a partially completed integrated circuit formed according to the method of FIG. 17.

Once the trenches 211a-b and 231 are formed (at process 712), the first trenches 211a-b are masked and a buried capacitor plate 234 for the deep trench capacitor can be formed in the substrate 210 adjacent to the lower portion of the second trench 231 (714, see FIG. 22). Techniques form forming buried capacitor plates are well known in the art and include, but are not limited to, implantation and out-diffusion techniques (e.g., see U.S. Pat. No. 6,271,142 of Gruening et al., issued on Aug. 7, 2001, assigned to International Business Machines Corporation and incorporated herein by reference). Thus, the details of such techniques are omitted from this specification in order to allow the reader to focus on the salient aspects of the embodiments described herein. Once the buried capacitor plate 234 is formed, the mask over the first trenches 211a-b is removed.

Figure 23:
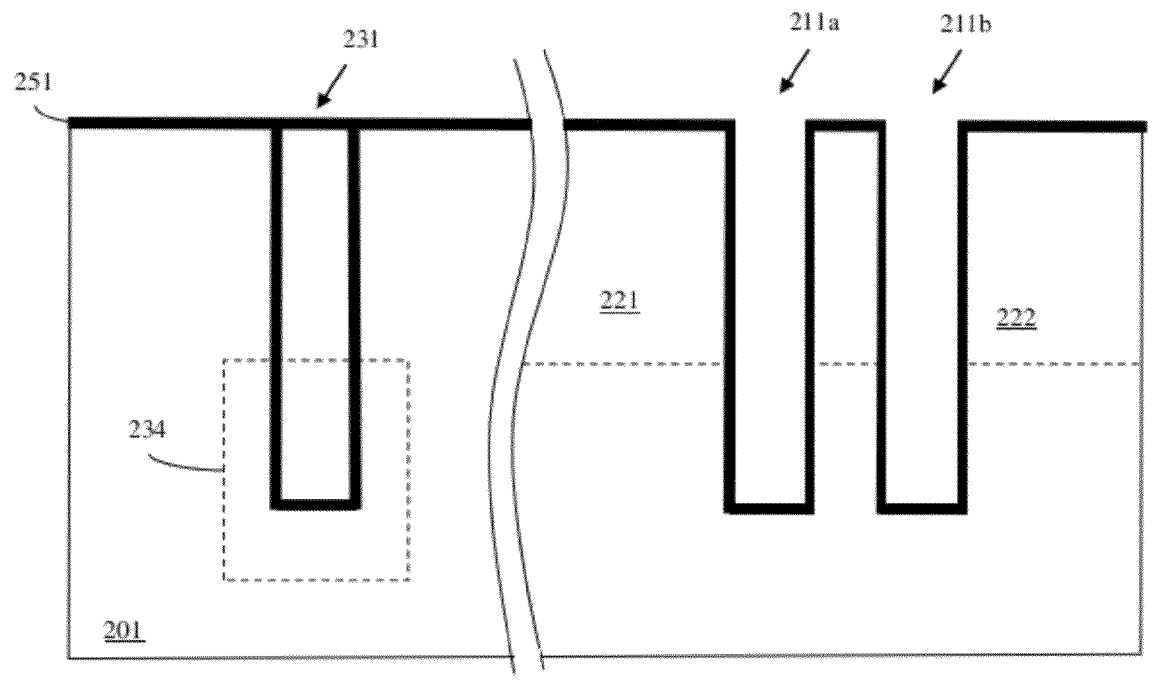
FIG. 23 is a cross-section diagram illustrating a partially completed integrated circuit formed according to the method of FIG. 17.

Then, a conformal insulator layer 251 can be formed in order to essentially simultaneously line all of the trenches 211a-b, 231 (716, see FIG. 23). For example, a conformal layer of an insulator material (e.g., an oxide material, a nitride material, an oxynitride material, and/or a high-k dielectric material) can be formed on the sidewalls and bottom surfaces of the trenches 211a-b, 231 using any suitable process (e.g., thermal oxidation, thermal nitridation, atomic layer deposition, chemical vapor deposition, etc.).

Figure 24:
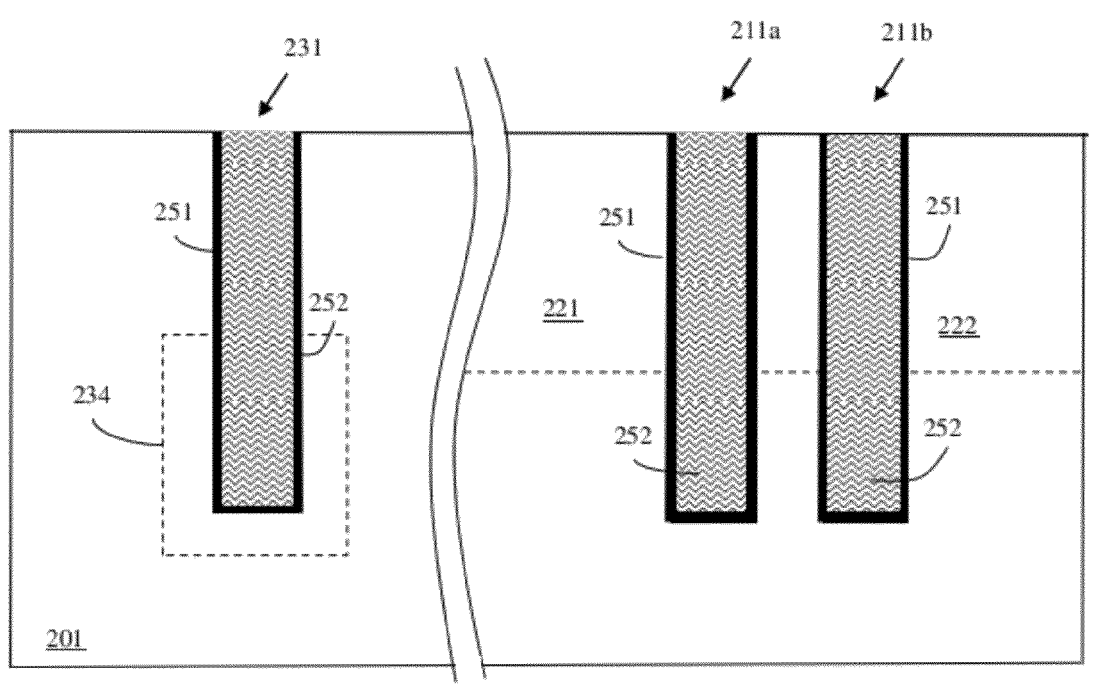
FIG. 24 is a cross-section diagram illustrating a partially completed integrated circuit formed according to the method of FIG. 17.

Next, a blanket layer of conductive material 252 can be deposited onto the conformal insulator layer 251 and, then, planarized in order to essentially simultaneously fill all of the trenches 211a-b, 231 (718, see FIG. 24). Thus, for the deep trench capacitor 230, the conformal insulator layer 251 lining the second trench 231 functions as the capacitor dielectric and the conductive material 252 within the second trench 231 functions as a capacitor plate in addition to the buried capacitor plate 234.

Figure 25:
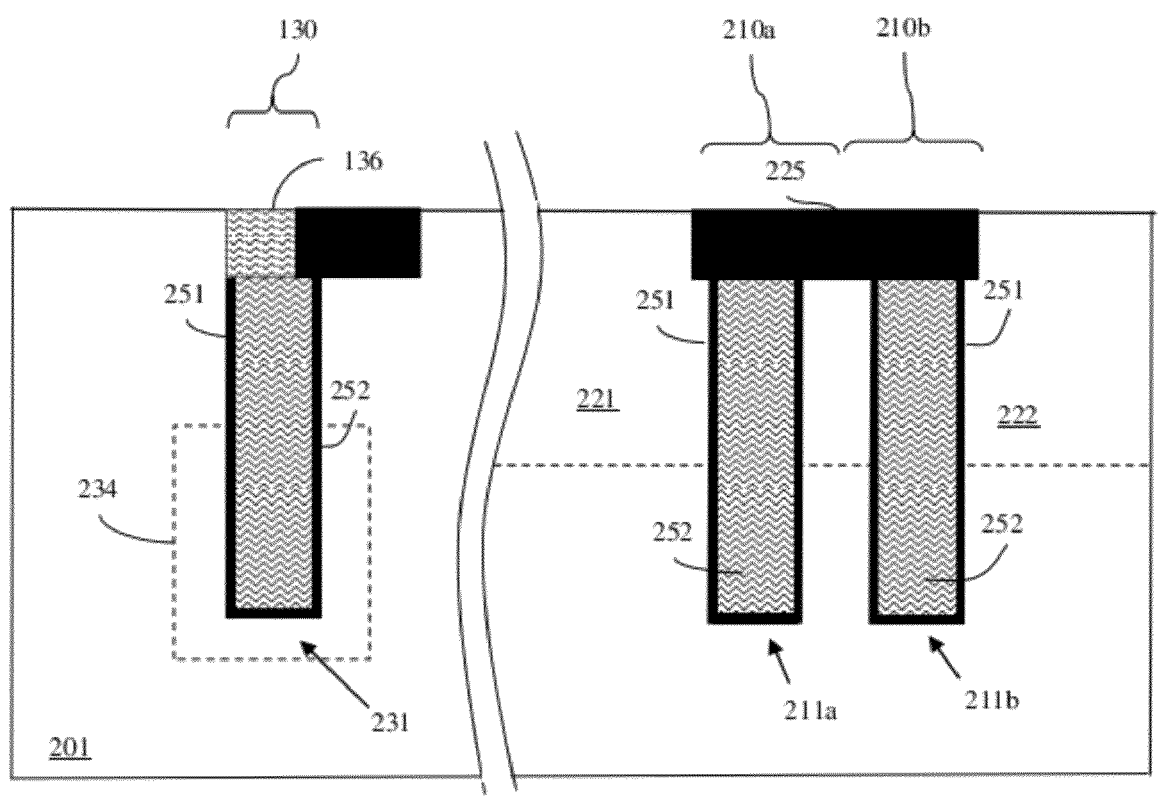
FIG. 25 is a cross-section diagram illustrating a partially completed integrated circuit formed according to the method of FIG. 17.

After the trenches 211a-b, 231 are filled (at process 718), a conductive strap 236 can be formed that electrically connects the conductive material 252 in the second trench 231 to a portion of the substrate 201 immediately adjacent to the second trench 231 (720, see FIG. 25). This conductive strap 236 will allow the conductive material 252 within the second trench 231 (i.e., the inner conductive plate within the deep trench capacitor 230) to be electrically connected to a device that will subsequently be formed (at process 724) within that portion of the substrate 201. The conductive strap 236 can be formed, for example, by first masking the first trenches 211a-b. Then, the conductive material 252 within the top portion of the second trench 231 can be recessed. After the conductive material is recessed, any exposed conformal insulator layer 251 on the upper sidewalls of the second trench 231 can be selectively removed. Next, an additional layer of conductive material (e.g., a doped polysilicon) can be deposited on top of the conductive material 252 to re-fill the second trench 231, thereby forming the conductive strap 236. In the resulting structure, the conductive strap 236 is located in the top portion of the second trench 231 above the conductive material 252 and conformal insulator layer 251 and is in contact with the portion of the substrate immediately adjacent to the upper sidewalls of the second trench 231.

It should be noted that the above-described technique for forming a conductive strap 236 is described herein for illustration purposes only and are not intended to be limiting. Any other suitable technique for forming a conductive strap that will connect a deep trench capacitor to a FET in order to create an eDRAM memory cell (e.g., a buried conductive strap) can, alternatively, be employed. Different techniques for forming such conductive straps are well-known in the art (e.g., see U.S. Patent Application No. 2009/0184392 of Cheng et al., published on Jul. 23, 2009, assigned to International Business Machines Corporation, and incorporated herein by reference) and, thus, the details are omitted from this specification in order to allow the reader to focus on the salient aspects of the embodiments described herein.

Additionally, using conventional processing techniques, shallow trench isolation (STI) structures can be formed at the top surface of the substrate in order to define the various device regions of the substrate 201 (722). During this STI formation process, at least one STI structure 225 can be formed such that it/they are located in the substrate 201 and aligned above the first trenches 211a-b (see FIG. 25). Specifically, a single STI structure 225 can be located above both first trenches 211a-b, as shown. Alternatively, discrete STI structures can be located above each first trench 211a-b. The STI structure(s) 225 can be positioned above the conductive material 252 in the first trenches 211a-b and can extend laterally beyond the sidewalls of the first trenches 211a-b such that it/they in combination with the conformal insulator layer 251 that lines the first trenches 211a-b encapsulates (i.e., completely isolates) the conductive material 251 within each of the first trenches 211a-b, thereby forming the adjacent deep trench isolation structures 210a-b (723). It should be noted that the isolation material in the STI structure(s) 225 can comprise either the same isolation material in the conformal isolation layer 151 or a different isolation material.

Finally, using conventional processing techniques, devices (e.g., 261-263) can be formed in the substrate 201 adjacent to the first and second trenches 211a-b, 231 (724, see FIGS. 14 and 15). Specifically, n-type field effect transistors (NFETs) 262 and p-type field effect transistors (PFETs) 262 (e.g., for either a logic circuit or a static random access memory (SRAM) array) can be formed in PWELL 222 and NWELL 221 regions of the substrate 201, respectively. Thus, the PFETs 261 and NFETs 262 will be isolated from each other by the adjacent deep trench isolation structures 210a-b. Furthermore, at least one additional device 263 can be formed in the substrate 201 adjacent to the second trench 231 such that it is electrically connected (e.g., by the conductive strap 236) to the conductive material 252 in the second trench 231. For example, this additional device 263 can comprise an additional field effect transistor that is formed adjacent to the second trench 231 such that one of its source/drain regions 270 is electrically connected (e.g., by the conductive strap 236) to the conductive material 252 in the second trench 231 (i.e., electrically connected to the inner conductive plate in the resulting deep trench capacitor 230), thereby creating an embedded dynamic random access memory (eDRAM) cell 240. It should be noted that if the conductive strap 236 is a doped polysilicon, it should be formed at process 720 such that it will have the same conductivity type as the source/drain region 270.

The resulting integrated circuit 100 of FIG. 1 and 2 or 200 of FIGS. 14 and 15 can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of an integrated circuit having, in a bulk substrate, at least one deep trench isolation structure and a deep trench capacitor. Also disclosed are embodiments of a method of forming the integrated circuit using integrated process steps. Specifically, the method embodiments can incorporate a single etch process to essentially simultaneously form, in a bulk semiconductor substrate, first and second trenches for a deep trench isolation structure and a deep trench capacitor, respectively. The width of the patterns used to form the trenches can be varied in order to selectively vary the depths of the trenches. Following formation of a buried capacitor plate adjacent to the lower portion of the second trench, both trenches can be essentially simultaneously lined with a conformal insulator layer and filled with a conductive material. Thus, for the deep trench capacitor, the conformal insulator layer lining the second trench functions as the capacitor dielectric and the conductive material within the second trench functions as a capacitor plate in addition to the buried capacitor plate. A shallow trench isolation (STI) structure can then be formed in the substrate extending across the top of the first trench in order to encapsulate the conductive material therein, thereby creating the deep trench isolation structure. By integrating these process steps many of key and expensive process steps can be shared, thereby resulting in a much lower total cost with improved density and excellent isolation.

What is claimed is:

1. A method of forming an integrated circuit structure, said method comprising:
    forming, in a mask layer on a substrate, a first pattern and a second pattern, said first pattern being for a first trench of a deep trench isolation structure and said second pattern being for a second trench of a deep trench capacitor;
    performing an etch process to form, in said substrate, said first trench and said second trench;
    forming a buried capacitor plate for said deep trench capacitor in said substrate adjacent to a lower portion of said second trench;
    forming a conformal insulator layer that lines said first trench and said second trench;
    depositing a layer of conductive material onto said conformal insulator layer to fill said first trench and said second trench level with a top surface of said substrate;
    forming a conductive strap electrically connecting said conductive material in said second trench to a portion of said substrate adjacent to said second trench, said forming of said conductive strap comprising:
        removing said conductive material from an upper portion of said second trench only;
        removing an exposed portion of said conformal insulator layer from said upper portion of said second trench; and
        depositing an additional layer of said conductive material to re-fill said upper portion of said second trench level with said top surface of said substrate;
    forming a shallow trench isolation structure above said conductive material in said first trench such that said shallow trench isolation structure in combination with said conformal insulator layer encapsulates said conductive material in said first trench; and
    forming devices in said substrate such that one of said devices is electrically connected to said conductive material in said second trench.

2. The method of claim 1, said first pattern being formed such that, after said performing of said etch process, said first trench comprises a continuous structure bordering a well region in said substrate.

3. The method of claim 1, said second pattern being formed such that, after said performing of said etch process, said second trench comprises a linear structure.

4. The method of claim 1, said first pattern and said second pattern being formed with different widths such that, after said performing of said etch process, said first trench has a different depth than said second trench.

5. The method of claim 1, said first pattern having a narrower width than said second pattern such that, after said performing of said etch process, said first trench is less deep than said second trench.

6. The method of claim 1, said forming of devices further comprising forming a source/drain region for said one of said devices within said portion of said substrate.

7. A method of forming an integrated circuit structure, said method comprising:
    forming, in a mask layer on a substrate, a first pattern and a second pattern,
        said first pattern being for at least two adjacent first trenches of at least two adjacent deep trench isolation structures that will isolate an NWELL region from a PWELL region in at least one of a logic circuit and a static random access memory (SRAM) array, said first pattern having a first section for patterning one of said two adjacent first trenches and a second section for patterning another of said two adjacent first trenches, said first section and said second section having different widths such that said two adjacent first trenches have different depths, and said second pattern being for a second trench of a deep trench capacitor that will be incorporated into an embedded dynamic random access memory (eDRAM) cell;

performing an etch process to form, in said substrate, said first trench and said second trench;

forming a buried capacitor plate for said deep trench capacitor in said substrate adjacent to a lower portion of said second trench;

forming a conformal insulator layer that lines said first trench and said second trench;

depositing a conductive material onto said conformal insulator layer to fill said first trench and said second trench;

forming a shallow trench isolation structure above said conductive material in said first trench such that said shallow trench isolation structure in combination with said conformal insulator layer encapsulates said conductive material in said first trench; and forming devices in said substrate, said forming of said devices comprising:

forming, in said PWELL region, n-type field effect transistors for said one of said logic circuit and said static random access memory (SRAM) array;

forming, in said NWELL region, p-type field effect transistors for said one of said logic circuit and said static random access memory (SRAM) array; and forming an additional field effect transistor for said embedded dynamic random access memory (eDRAM) cell, said additional field effect transistor being formed adjacent to said second trench such that a source/drain region of said additional field effect transistor is electrically connected to said conductive material in said second trench.

8. The method of claim 7, said first pattern being formed such that, after said performing of said etch process, said first trenches comprising a first continuous structure bordering said NWELL region; and a second continuous structure separated from and surrounding an outside edge of said first continuous structure such that said first trenches are essentially concentric.

9. The method of claim 7, said second pattern being formed such that, after said performing of said etch process, said second trench comprises a linear structure.

10. The method of claim 7, said second pattern being formed with a different width than said first section and said second section of said first pattern such that, after said performing of said etch process, said second trench has a different depth than said first trench.

11. The method of claim 10, said different width being such that said first trenches are less deep than said second trench.

12. The method of claim 7, further comprising:

forming a conductive strap electrically connecting said conductive material in said second trench to a portion of said substrate adjacent to said second trench, said forming of devices further comprising forming said source/drain region for said additional field effect transistor within said portion of said substrate.

13. A method of forming an integrated circuit structure, said method comprising:

forming, in a mask layer on a substrate, a first pattern and a second pattern, said first pattern being for at least two adjacent first trenches of at least two adjacent deep trench isolation structures and said second pattern being for a second trench of a deep trench capacitor;

performing an etch process to form, in said substrate, said first trenches and said second trench:

forming a buried capacitor plate for said deep trench capacitor in said substrate adjacent to a lower portion of said second trench;

forming a conformal insulator layer that lines said first trenches and said second trench;

depositing a conductive material onto said conformal insulator layer to fill said first trenches and said second trench;

forming at least one shallow trench isolation structure above said conductive material in said first trenches such that said at least one shallow trench isolation structure in combination with said conformal insulator layer encapsulates said conductive material in said first trenches; and forming devices in said substrate such that one of said devices is electrically connected to said conductive material in said second trench said first pattern having a first section for patterning one of said two adjacent first trenches and a second section for patterning another of said two adjacent trenches, said first section and said second section having different widths such that said two adjacent first trenches have different depths.

14. A method of forming an integrated circuit structure, said method comprising:

forming, in a mask layer on a substrate, a first pattern and a second pattern, said first pattern being for at least two adjacent first trenches of at least two adjacent deep trench isolation structures, said first pattern having a first section for patterning one of said two adjacent first trenches and a second section for patterning another of said two adjacent first trenches, said first section and said second section having different widths such that said two adjacent first trenches have different depths, and said second pattern being for a second trench of a deep trench capacitor;

performing an etch process to form, in said substrate, said first trenches and said second trench;

forming a buried capacitor plate for said deep trench capacitor in said substrate adjacent to a lower portion of said second trench;

forming a conformal insulator layer that lines said first trenches and said second trench;

depositing a conductive material onto said conformal insulator layer to fill said first trenches and said second trench;

forming at least one shallow trench isolation structure above said conductive material in said first trenches such that said at least one shallow trench isolation structure in combination with said conformal insulator layer encapsulates said conductive material in said first trenches; and forming devices in said substrate such that one of said devices is electrically connected to said conductive material in said second trench.

15. The method of claim 14, said first pattern being formed such that, after said performing of said etch process, said first trenches comprise: a first continuous structure bordering a well region in said substrate; and a second continuous structure separated from and surrounding an outside edge of said first continuous structure such that said first trenches are essentially concentric.

16. The method of claim 14, said second pattern being formed such that, after said performing of said etch process, said second trench comprises a linear structure.

17. The method of claim 14, said second pattern being formed with a different width than said first section and said second section of said first pattern such that, after said performing of said etch process, said second trench has a different depth than said first trenches.

18. The method of claim 14, said different width being such that said first trenches are less deep than said second trench.

19. The method of claim 14, further comprising:

forming a conductive strap electrically connecting said conductive material in said second trench to a portion of said substrate adjacent to said second trench, said forming of devices comprising forming a source/drain region for said one of said devices within said portion of said substrate.

* * * * *